United States Patent
Lee et al.

(10) Patent No.: US 11,785,822 B2
(45) Date of Patent: Oct. 10, 2023

(54) DISPLAY APPARATUS INCLUDING CONCAVE PORTION

(71) Applicant: Samsung Display Co., Ltd., Yongin-si (KR)

(72) Inventors: Wonjun Lee, Yongin-si (KR); Hyunbae Park, Yongin-si (KR); Waljun Kim, Yongin-si (KR); Kiwan Ahn, Yongin-si (KR); Joosun Yoon, Yongin-si (KR); Kilyoung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 306 days.

(21) Appl. No.: 17/089,707

(22) Filed: Nov. 4, 2020

(65) Prior Publication Data
US 2021/0359009 A1    Nov. 18, 2021

(30) Foreign Application Priority Data

May 14, 2020    (KR) .......................... 10-2020-0057821

(51) Int. Cl.
*H01L 27/32*    (2006.01)
*H01L 51/50*    (2006.01)
(Continued)

(52) U.S. Cl.
CPC ........ *H01L 27/322* (2013.01); *H01L 27/3218* (2013.01); *H01L 51/5253* (2013.01);
(Continued)

(58) Field of Classification Search
CPC .............. H01L 27/322; H01L 27/3218; H01L 27/3246; H01L 27/3211; H01L 27/3223; H01L 27/3272; H01L 27/3276; H01L 27/3265; H01L 51/5253; H01L 51/5268; H01L 51/5284; H01L 51/502; H01L 2251/5369; H01L 2251/301; G02F 1/133512; G02F 1/136209;
(Continued)

(56) References Cited

U.S. PATENT DOCUMENTS 7,932,109 B2    4/2011   Hayata et al.
10,330,918 B1 *  6/2019   Sakai ...................... G02B 5/20
(Continued)

FOREIGN PATENT DOCUMENTS

EP    0 989 778 A1    3/2000
KR    10-1037037 B1   5/2011
(Continued)

*Primary Examiner* — Ida M Soward
(74) *Attorney, Agent, or Firm* — Lewis Roca Rothgerber Christie LLP

(57) ABSTRACT

A display apparatus includes: a first pixel, a second pixel, and a third pixel respectively configured to emit different colors; a first partition wall on a first light-emitting device of the first pixel; and a first color conversion layer corresponding to an emission area of the first pixel. The first partition wall has a first opening corresponding to the first light-emitting device and a first concave portion spaced apart from the first opening in a plan view. The first color conversion layer includes first quantum dots configured to convert incident light into first color light.

20 Claims, 18 Drawing Sheets

(51) Int. Cl.
  *H01L 51/52* (2006.01)
  *G02F 1/13* (2006.01)
  *G02F 1/1335* (2006.01)
  *G02F 1/1362* (2006.01)

(52) U.S. Cl.
  CPC .. *G02F 1/133512* (2013.01); *G02F 1/133514* (2013.01); *G02F 1/136209* (2013.01); *G09G 2300/0408* (2013.01); *G09G 2300/0804* (2013.01); *H01L 27/3265* (2013.01); *H01L 27/3276* (2013.01); *H01L 2251/301* (2013.01)

(58) Field of Classification Search
  CPC .. G02F 1/133514; G02F 2001/136222; G09G 2300/0408; G09G 2300/0804
  See application file for complete search history.

(56) References Cited

U.S. PATENT DOCUMENTS

| | | | |
|---|---|---|---|
| 10,367,123 | B2 | 7/2019 | Im et al. |
| 2007/0077349 | A1 | 4/2007 | Newman et al. |
| 2009/0147188 | A1 | 6/2009 | Yang et al. |
| 2010/0213827 | A1 | 8/2010 | Yoshida et al. |
| 2014/0160408 | A1* | 6/2014 | Cho ................ G02F 1/133617 349/110 |
| 2015/0285969 | A1* | 10/2015 | Kim ................ G02B 5/201 359/891 |
| 2017/0315389 | A1* | 11/2017 | Chu ................ G02F 1/133377 |
| 2017/0343853 | A1* | 11/2017 | Lee ................ G02F 1/133514 |
| 2018/0088404 | A1* | 3/2018 | Chae ................ G02F 1/133514 |
| 2018/0143497 | A1* | 5/2018 | Kim ................ H01L 27/1218 |
| 2019/0025634 | A1 | 1/2019 | Park et al. |
| 2019/0051706 | A1* | 2/2019 | Song ................ H01L 51/5278 |
| 2019/0113799 | A1* | 4/2019 | Shin ................ G02F 1/1337 |
| 2019/0131492 | A1* | 5/2019 | Kang ................ H01L 51/502 |
| 2019/0137815 | A1* | 5/2019 | Kim ................ H01L 27/3265 |
| 2019/0212610 | A1 | 7/2019 | Kim et al. |
| 2019/0348470 | A1* | 11/2019 | Song ................ H01L 51/5268 |
| 2020/0089047 | A1* | 3/2020 | Baek ................ G02F 1/1336 |
| 2020/0343310 | A1* | 10/2020 | Bae ................ H01L 27/322 |
| 2020/0365833 | A1* | 11/2020 | Joo ................ H01L 51/5253 |

FOREIGN PATENT DOCUMENTS

| | | |
|---|---|---|
| KR | 10-1730164 B1 | 4/2017 |
| KR | 10-2018-0055021 A | 5/2018 |
| KR | 10-2019-0089318 A | 7/2019 |
| WO | WO 2009/011922 A1 | 1/2009 |

* cited by examiner

DISPLAY APPARATUS INCLUDING CONCAVE PORTION

CROSS-REFERENCE TO RELATED APPLICATION

This application claims priority to and the benefit of Korean Patent Application No. 10-2020-0057821, filed on May 14, 2020, in the Korean Intellectual Property Office, the disclosure of which is incorporated herein in its entirety by reference.

BACKGROUND

1. Field

Aspects of embodiments relate to a display apparatus.

2. Description of Related Art

A display apparatus is an apparatus for visually displaying data. Display apparatuses may be used as displays of small products, such as mobile phones, or may be used as displays of large products, such as televisions.

A display apparatus includes a plurality of pixels that receive an electric signal and emit light to display an image to the outside. Each pixel may include a light-emitting device. For example, an organic light-emitting display apparatus includes an organic light-emitting diode (OLED) as a light-emitting device. Generally, an organic light-emitting display apparatus includes a thin-film transistor and an OLED on a substrate, and the OLED emits light by itself (is self-emissive).

Recently, as the use of display apparatuses has diversified, various designs have been attempted to improve the quality of display apparatuses.

SUMMARY

Embodiments of the present disclosure provide a display apparatus exhibiting improved color implementation from each pixel and improved light extraction efficiency. However, is merely one example, and the scope of the present disclosure is not limited thereby.

Additional aspects and features will be set forth, in part, in the description which follows and, in part, will be apparent from the description or may be learned by practice of the described embodiments of the present disclosure.

According to an embodiment, a display apparatus includes: a first pixel, a second pixel, and a third pixel respectively configured to emit different colors; a first partition wall on a first light-emitting device of the first pixel; and a first color conversion layer corresponding to an emission area of the first pixel. The first partition wall has a first opening corresponding to the first light-emitting device and a first concave portion spaced apart from the first opening in a plan view. The first color conversion layer includes first quantum dots configured to convert incident light into first color light.

The first color conversion layer may be in the first opening.

The display apparatus may further include: a second color conversion layer corresponding to an emission area of the second pixel, the second color conversion layer including second quantum dots configured to convert incident light into second color light; and a transmissive layer corresponding to an emission area of the third pixel, the transmissive layer including scattering particles.

The first partition wall may have a second opening corresponding to a second light-emitting device of the second pixel, and the second color conversion layer may be in the second opening.

The first partition wall may have a second concave portion spaced apart from the second opening in the plan view.

The first concave portion may be integrally formed with the second concave portion.

The first partition wall may have a third opening corresponding to a third light-emitting device of the third pixel, and the transmissive layer may be in the third opening.

The display apparatus may further include: a first color filter overlapping the first color conversion layer; a second color filter overlapping the second color conversion layer; a third color filter overlapping the transmissive layer; and a light blocking layer between the first color filter and the second color filter, between the second color filter and the third color filter, and between the first color filter and the third color filter.

The first opening may have a first portion overlapping the first color filter and a second portion overlapping the light blocking layer.

The first color conversion layer may be in the first portion of the first opening.

The display apparatus may further include a first dummy color conversion layer in the second portion of the first opening.

The first concave portion may overlap the light blocking layer.

The first concave portion may at least partially expose the light blocking layer.

The third color filter may include the same material as the light blocking layer.

The display apparatus may further include a second partition wall between the first light-emitting device and the first partition wall.

The first partition wall may be integrally formed with the second partition wall.

According to an embodiment, a display apparatus includes: a first pixel, a second pixel, and a third pixel respectively configured to emit different colors; a display unit including a light-emitting device; and a color filter unit facing the display unit. The color filter unit includes: a color conversion layer including quantum dots configured to convert incident light; and a partition wall having an opening corresponding to the light-emitting device and a concave portion spaced apart from the opening in a plan view.

The color filter unit may further include a light blocking layer, and the concave portion may overlap the light blocking layer.

The concave portion may at least partially expose the light blocking layer.

The color conversion layer may be in the opening.

Other aspects and features of the present disclosure will be further understood through the accompanying drawings, the detailed description, and the claims.

BRIEF DESCRIPTION OF THE DRAWINGS

The above and other aspects and features of embodiments of the present disclosure will be more apparent from the following description taken in conjunction with the accompanying drawings, in which.

DETAILED DESCRIPTION

Figure 1:
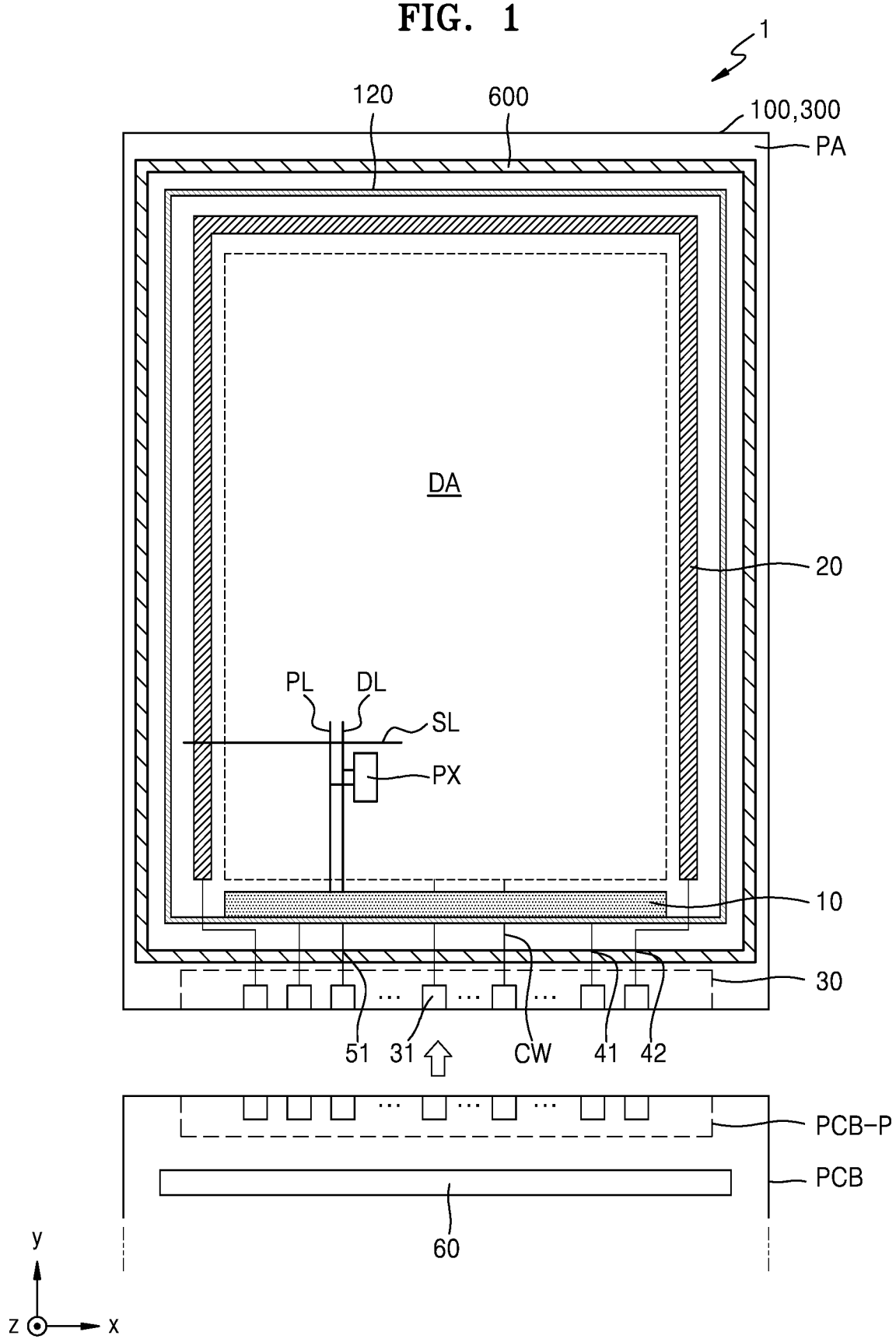
FIGS. 1 and 2 are schematic plan views of a display apparatus according to an embodiment.

Reference will now be made, in detail, to embodiments, examples of which are illustrated in the accompanying drawings. The illustrated embodiments may have different forms and should not be construed as being limited to the descriptions set forth herein. Accordingly, the embodiments that are described below in conjunction with the figures are provided to explain aspects and features of the present description.

The present disclosure may have (or include) various modifications and embodiments. Example embodiments are illustrated in the drawings and will be described, in detail, in the detailed description. The aspects and features of the present disclosure and methods of achieving them will become more apparent from the following embodiments that are described, in detail, in conjunction with the accompanying drawings. However, the present disclosure is not limited to the following embodiments and may be embodied in various forms.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Sizes of elements in the drawings may be exaggerated for convenience of description. Because the sizes and thicknesses of elements in the drawings may be arbitrarily illustrated for convenience, the present disclosure is not limited thereto.

In this specification, the expression "A and/or B" indicates only A, only B, or both A and B. Also, in this specification, the expression "at least one of A and B" indicates only A, only B, or both A and B.

In the following embodiments, the expression "a line extends in a first direction or a second direction" may include an embodiment in which "a line extends in a linear shape" and an embodiment in which "a line extends in a zigzag or curved shape in a first direction or a second direction."

In the following embodiments, the term "in a plan view" indicates that a target portion is viewed from above, and the term "in a cross-sectional view" indicates that a vertically cut cross-section of a target portion is taken from a side. In the following embodiments, the term "overlapping" may include overlapping "in a plan view" and "in a cross-sectional view."

Hereinafter, embodiments will be described, in detail, with reference to the accompanying drawings. When describing embodiments with reference to the accompanying drawings, the same or corresponding elements are denoted by the same reference numerals.

Figure 2:
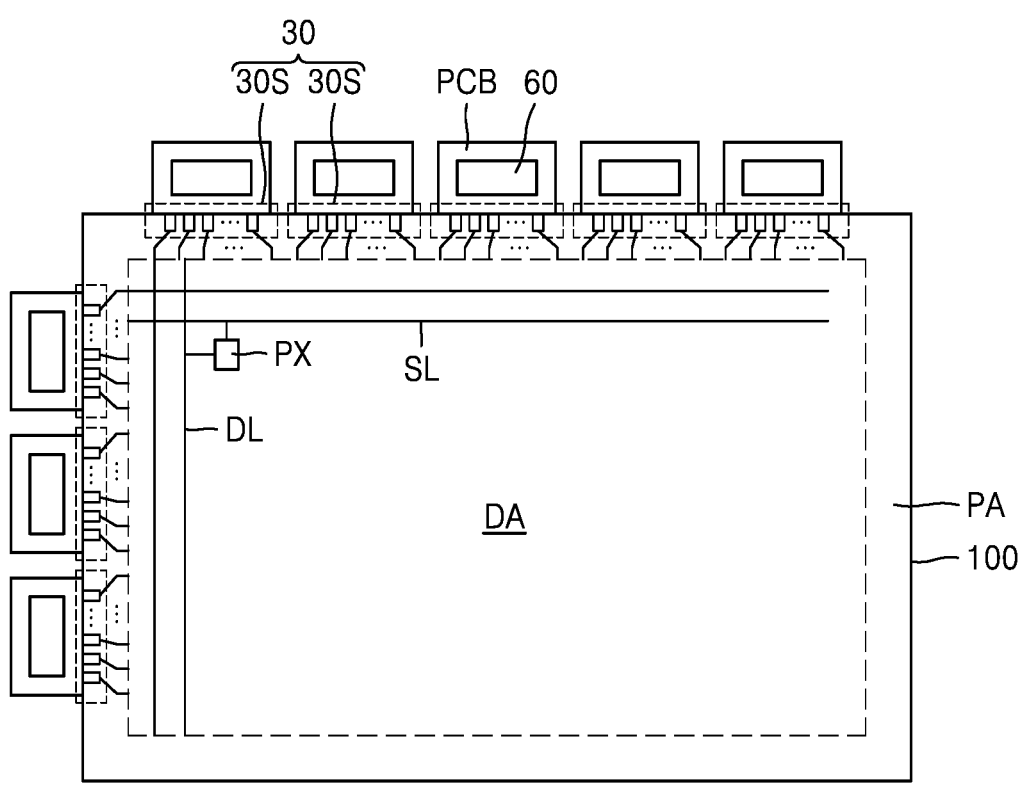

FIGS. 1 and 2 are schematic plan views of a display apparatus 1 according to an embodiment.

Referring to FIG. 1, the display apparatus 1 may include a substrate 100 and an upper substrate 300 that are bonded to each other by a sealing member 600. The sealing member 600 may surround (e.g., may extend along) the outer surfaces (or outer edges) of the substrate 100 and the upper substrate 300 such that the substrate 100 and the upper substrate 300 are bonded to each other.

The display apparatus 1 may have a display area DA and a peripheral area PA arranged around (e.g., extending around a periphery of) the display area DA. The display apparatus 1 may provide an image by using light emitted from a plurality of pixels PX arranged in the display area DA.

The display area DA may include a scan line SL extending in an x direction and pixels PX connected to a data line DL extending in a y direction crossing (e.g., perpendicular to) the x direction. The pixels PX may each be connected to a driving voltage line PL extending in the y direction.

The pixels PX may each include a display element, such as an organic light-emitting diode. The pixels PX may each emit, for example, red, green, blue, or white light from the organic light-emitting diode. The term "pixel PX" as used herein may be understood as a pixel that emits one of red light, green light, blue light, and white light as described above. In some embodiments, the organic light-emitting diodes included in the pixels PX may emit light of the same color (e.g., pieces of light of the same color), and the color of each pixel PX may be implemented by a color filter or the like arranged on the organic light-emitting diode. For example, the organic light-emitting diodes included in the pixels PX (e.g., included in all of the pixels PX) may emit blue light.

The pixels PX may be electrically connected to internal circuits arranged in the peripheral area PA. A first power supply line 10, a second power supply line 20, and a pad portion 30 may be arranged in the peripheral area PA.

The first power supply line 10 may be arranged to correspond to (e.g., to extend along) one side of the display area DA. The first power supply line 10 may be connected to a plurality of driving voltage lines PL, through which a driving voltage (ELVDD in, for example, FIGS. 3 and 4) is transmitted to the pixels PX.

The second power supply line 20 may partially surround (e.g., may partially extend around or may extend around three sides of) the display area DA in a loop shape with one side open. The second power supply line 20 may provide a common voltage to an opposite electrode of the pixel PX. The second power supply line 20 may be referred to as a common voltage supply line.

The pad portion 30 may include a plurality of pads 31 and may be arranged on one side (e.g., along one edge) of the substrate 100. The pads 31 may each be connected to a first connection wiring 41 connected to the first power supply line 10 or may be connected to a connection wiring CW extending to the display area DA. The pads 31 of the pad portion 30 may not be covered by an insulating layer (e.g., may be exposed through an insulation layer) and, thus, may be electrically connected to a printed circuit board PCB. A PCB terminal PCB-P of the printed circuit board PCB may be electrically connected to the pad portion 30.

The printed circuit board PCB may transmit power or a signal of a controller to the pad portion 30. The controller may provide a power supply voltage (ELVDD in, for example, FIGS. 3 and 4) and a common voltage (ELVSS in, for example, FIGS. 3 and 4) to the first power supply line 10 and the second power supply line 20 through the first connection wiring 41 and the second connection wiring 42, respectively.

A data driving circuit 60 may be electrically connected to the data line DL. A data signal of the data driving circuit 60 may be provided to the pixels PX through the connection wiring CW connected to the pad portion 30 and the data line DL connected to the connection wiring CW. In the embodiment illustrated in FIG. 1, the data driving circuit 60 is arranged on the printed circuit board PCB. However, in another embodiment, the data driving circuit 60 may be arranged on the substrate 100. For example, the data driving circuit 60 may be between the pad portion 30 and the first power supply line 10.

A dam portion 120 may be arranged in the peripheral area PA. When an organic encapsulation layer (e.g., 420 in FIG. 18) of a thin-film encapsulation layer 400 is formed, the dam portion 120 may block organic materials from flowing in an edge direction of the substrate 100 to prevent (or substantially prevent) an edge tail of the organic encapsulation layer 420 from being formed. The dam portion 120 may be arranged in the peripheral area PA to surround at least part of (e.g., to partially surround or to partially extend around) the display area DA. The dam portion 120 may include a plurality of dams. In an embodiment including the plurality of dams, the dams may be spaced apart from each other. The dam portion 120 may be arranged closer to the display area DA than the sealing member 600 in the peripheral area PA (e.g., the dam portion 120 may be arranged between the display area DA and the sealing member 600). A built-in driving circuit that provides a scan signal of each pixel may also be provided in the peripheral area PA. In some embodiments, the built-in driving circuit and the dam portion 120 may overlap each other.

Although one printed circuit board PCB is illustrated as being attached to the pad portion 30 in the embodiment illustrated in FIG. 1, a plurality of printed circuit boards PCB may be attached to the pad portion 30, as illustrated in, for example, FIG. 2.

Referring to FIG. 2, the pad portion 30 may be arranged along two sides of the substrate 100. The pad portion 30 may include a plurality of sub-pad portions 30S, and one printed circuit board PCB may be attached to each of the sub-pad portions 30S.

Figure 3:
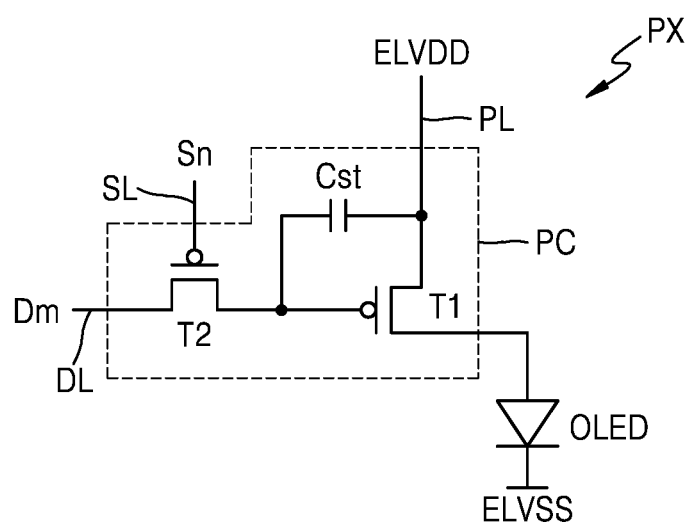
FIGS. 3 and 4 are equivalent circuit diagrams of a pixel included in a display apparatus according to an embodiment.
Figure 4:
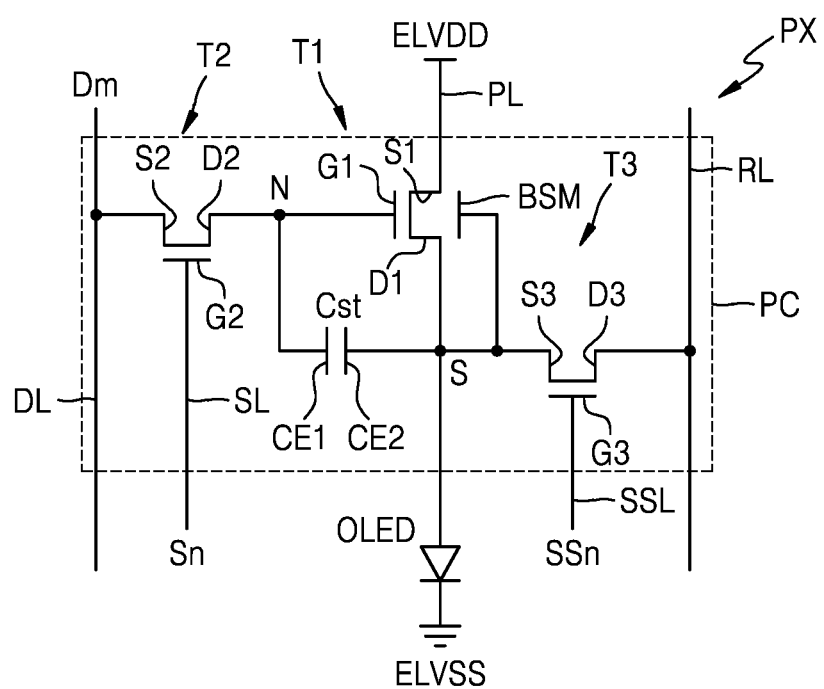

FIGS. 3 and 4 are equivalent circuit diagrams of a pixel that may be included in a display apparatus.

Referring to FIG. 3, a pixel PX may include a pixel circuit PC connected to a scan line SL and a data line DL and an organic light-emitting diode OLED connected to the pixel circuit PC.

The pixel circuit PC may include a driving thin-film transistor T1, a switching thin-film transistor T2, and a storage capacitor Cst. The switching thin-film transistor T2 may be connected to the scan line SL and the data line DL and may be configured to transfer a data signal Dm input through the data line DL to the driving thin-film transistor T1 according to a scan signal Sn input through the scan line SL.

The storage capacitor Cst may be connected to the switching thin-film transistor T2 and the driving voltage line PL and may be configured to store a voltage corresponding to a difference between a voltage received from the switching thin-film transistor T2 and a first power supply voltage ELVDD (e.g., a driving voltage) supplied to the driving voltage line PL.

The driving thin-film transistor T1 may be connected to the driving voltage line PL and the storage capacitor Cst and may be configured to control a driving current flowing from the driving voltage line PL to the organic light-emitting diode OLED according to a voltage (e.g., a voltage value) stored in the storage capacitor Cst. The organic light-emitting diode OLED may emit light having a luminance according to the driving current.

A case in which the pixel circuit PC includes two thin-film transistors and one storage capacitor has been described with reference to FIG. 3, but the present disclosure is not limited thereto.

Referring to FIG. 4, the pixel PX may include an organic light-emitting diode OLED and a pixel circuit PC including a plurality of thin-film transistors that drive the organic light-emitting diode OLED. The pixel circuit PC may include a driving thin-film transistor T1, a switching thin-film transistor T2, a sensing thin-film transistor T3, and a storage capacitor Cst.

A scan line SL may be connected to a gate electrode G2 of the switching thin-film transistor T2, a data line DL may be connected to a source electrode S2 of the switching thin-film transistor T2, and a first electrode CE1 of the storage capacitor Cst may be connected to a drain electrode D2 of the switching thin-film transistor T2.

Therefore, the switching thin-film transistor T2 may supply a data voltage of (or from) the data line DL to a first node N in response to the scan signal Sn from the scan line SL of each pixel PX.

A gate electrode G1 of the driving thin-film transistor T1 may be connected to the first node N, a source electrode S1 of the driving thin-film transistor T1 may be connected to the driving voltage line PL configured to transmit the driving voltage ELVDD, and a drain electrode D1 of the driving thin-film transistor T1 may be connected to a pixel electrode of the organic light emitting diode OLED.

Therefore, the driving thin-film transistor T1 may control an amount of current flowing through the organic light-emitting diode OLED according to a gate-source voltage Vgs of the driving thin-film transistor T1, that is, a voltage between the driving voltage ELVDD and the first node N.

A sensing control line SSL may be connected to a gate electrode G3 of the sensing thin-film transistor T3, a source electrode S3 of the sensing thin-film transistor T3 may be connected to a second node S, and a drain electrode D3 of the sensing thin-film transistor T3 may be connected to a reference voltage line RL. In some embodiments, the sensing thin-film transistor T3 may be controlled by the scan line SL instead of by the sensing control line SSL.

The sensing thin-film transistor T3 may sense a potential of the pixel electrode of the organic light-emitting diode OLED. The sensing thin-film transistor T3 may supply a pre-charging voltage from the reference voltage line RL to the second node S in response to a sensing signal SSn from the sensing control line SSL or may supply a voltage of the pixel electrode of the organic light-emitting diode OLED to the reference voltage line RL during a sensing period.

The first electrode CE1 of the storage capacitor Cst may be connected to the first node N, and a second electrode CE2 of the storage capacitor Cst may be connected to the second node S. The storage capacitor Cst may charge a voltage difference between voltages supplied to the first and second nodes N and S and may supply a driving voltage to the driving thin-film transistor T1. For example, the storage capacitor Cst may charge a voltage difference between a data signal Dm supplied to each of the first node N and the second node S and a pre-charging voltage Vpre.

A bias electrode BSM may be formed to correspond to the driving thin-film transistor T1 and may be connected to the source electrode S3 of the sensing thin-film transistor T3.

Because the bias electrode BSM receives a voltage in connection with the potential of the source electrode S3 of the sensing thin-film transistor T3, the driving thin-film transistor T1 may be stabilized. In some embodiments, the bias electrode BSM may be connected to a separate bias wiring instead of being connected to the source electrode S3 of the sensing thin-film transistor T3.

The opposite electrode of the organic light-emitting diode OLED may receive a common voltage ELVSS. The organic light-emitting diode OLED may receive a driving current from the driving thin-film transistor T1 and emit light.

FIG. 4 illustrates an embodiment in which the signal lines SL, SSL, and DL, the reference voltage line RL, and the driving voltage line PL are provided for each pixel PX, but the present disclosure is not limited thereto. For example, at least one of the signal lines SL, SSL, and DL, and/or the reference voltage line RL, and the driving voltage line PL may be shared with (e.g., may be common to) the adjacent pixels.

The pixel circuit PC is not limited to the number and the circuit design of the thin-film transistors and the storage capacitors described above with reference to FIGS. 3 and 4, and the number and the circuit design of the thin-film transistors and the storage capacitors may be variously changed.

Figure 5:
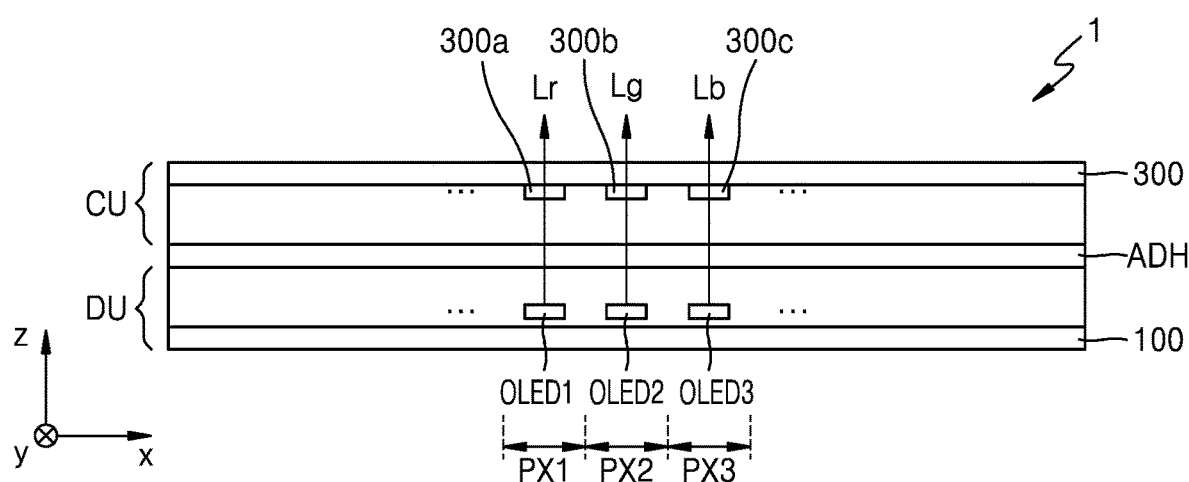
FIG. 5 is a schematic cross-sectional view of a display apparatus according to an embodiment.

FIG. 5 is a schematic cross-sectional view of the display apparatus 1 according to an embodiment.

Referring to FIG. 5, the display apparatus 1 may include a display unit DU and a color filter unit CU arranged to face the display unit DU. The display unit DU may include first to third pixels PX1, PX2, and PX3, which are arranged on the substrate 100. The first to third pixels PX1, PX2, and PX3 may be pixels that emit light of different colors on the substrate 100. For example, the first pixel PX1 may emit red light Lr, the second pixel PX2 may emit green light Lg, and the third pixel PX3 may emit blue light Lb.

The first to third pixels PX1, PX2, and PX3 may include first to third light-emitting devices OLED1, OLED2, and OLED3, each including an organic light-emitting diode OLED. In an embodiment, the first to third light-emitting devices OLED1, OLED2, and OLED3 may emit blue light. In another embodiment, the first to third light-emitting devices OLED1, OLED2, and OLED3 may emit red light Lr, green light Lg, and blue light Lb, respectively. In another embodiment, the first to third light-emitting devices OLED1, OLED2, and OLED3 may emit light in which blue light and green light are mixed.

The color filter unit CU may include first to third filters 300a, 300b, and 300c. The light emitted from the first to third light-emitting devices OLED1, OLED2, and OLED3 may pass through the first to third filters 300a, 300b, and 300c and be emitted as red light Lr, green light Lg, and blue light Lb, respectively.

The first to third filters 300a, 300b, and 300c may be located directly on the upper substrate 300. The phrase "located directly on the upper substrate 300" indicates that the first to third filters 300a, 300b, and 300c are formed directly on the upper substrate 300 to manufacture the color filter unit CU. Thereafter, the first to third filters 300a, 300b, and 300c may be arranged to face the first to third pixels PX1, PX2, and PX3, respectively, and the display unit DU and the color filter unit CU may be bonded to each other.

FIG. 5 illustrates an embodiment in which the display unit DU and the color filter unit CU are bonded to each other by an adhesive layer ADH. The adhesive layer ADH may be, for example, an optical clear adhesive (OCA) but is not necessarily limited thereto. In another embodiment, the adhesive layer ADH may be omitted.

Figure 6:
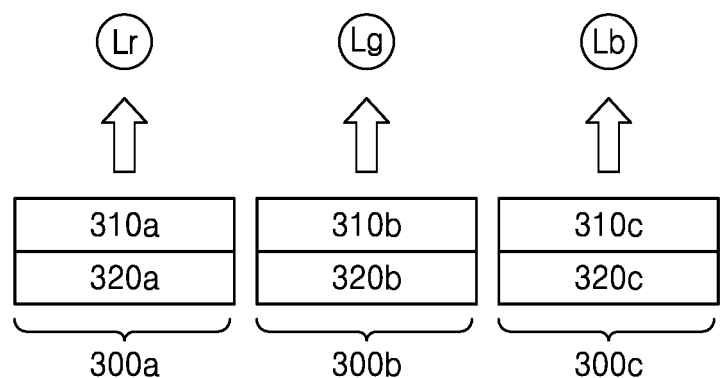
FIG. 6 is a partial enlarged view of a display apparatus according to an embodiment.

FIG. 6 is a partial enlarged view of the display apparatus 1 according to an embodiment.

Referring to FIG. 6, the first filter 300a may include a first color filter 310a and a first color conversion layer 320a, the second filter 300b may include a second color filter 310b and a second color conversion layer 320b, and the third filter 300c may include a third color filter 310c and a transmissive layer 320c. In an embodiment, the first color filter 310a may overlap the first color conversion layer 320a, the second color filter 310b may overlap the second color conversion layer 320b, and the third color filter 310c may overlap the transmissive layer 320c.

In an embodiment, the first color conversion layer 320a and the second color conversion layer 320b may each include a quantum dot material. A core of the quantum dot may be selected from Group II-VI compounds, Group III-V compounds, Group IV-VI compounds, Group IV elements, Group IV compounds, and any combination thereof.

The Group II-VI compounds may be selected from: a binary compound selected from CdSe, CdTe, ZnS, ZnSe, ZnTe, ZnO, HgS, HgSe, HgTe, MgSe, MgS, and any mixtures thereof; a ternary compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixtures thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and any mixtures thereof.

The Group III-V compounds may be selected from: a binary compound selected from GaN, GaP, GaAs, GaSb, AlN, AlP, AlAs, AlSb, InN, InP, InAs, InSb, and any mixtures thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any mixtures thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixtures thereof.

The Group IV-VI compounds may be selected from: a binary compound selected from SnS, SnSe, SnTe, PbS, PbSe, PbTe, and any mixtures thereof; a ternary compound selected from SnSeS, SnSeTe, SnSTe, PbSeS, PbSeTe, PbSTe, SnPbS, SnPbSe, SnPbTe, and any mixtures thereof; and a quaternary compound selected from SnPbSSe, SnPbSeTe, SnPbSTe, and any mixtures thereof. The Group IV element may be selected from Si, Ge, and any mixtures thereof. The Group IV element may include a binary compound selected from SiC, SiGe, and any mixtures thereof.

The binary compound, the ternary compound, or the quaternary compound may be present in particles at a uniform concentration or may be present in the same particles in partially different concentration distributions. Also, one quantum dot may have a core/shell structure surrounding another quantum dot. An interface between the core and the shell may have a concentration gradient in which the concentration of elements in the shell decreases toward a center of the core.

In some embodiments, the quantum dot may have a core-shell structure that includes a core including a nanocrystal and a shell surrounding the core. The shell of the quantum dot may act as a protective layer that maintains semiconductor properties by preventing (or substantially preventing) chemical denaturation of the core and/or a charging layer that imparts electrophoretic properties to the quantum dots. The shell may include a single layer or may have a multi-layer structure. An interface between the core and the shell may have a concentration gradient in which the concentration of elements in the shell decreases toward the center of the core. Examples of the shell of the quantum dot may include a metal or non-metal oxide, a semiconductor compound, or any combinations thereof.

For example, the metal or non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound, such as $MgAl_2O_4$, $CoFe_2O_4$, $NiFe_2O_4$, and $CoMn_2O_4$, but the present disclosure is not limited thereto.

Also, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but the present disclosure is not limited thereto.

The quantum dot may have a full width of half maximum (FWHM) of an emission wavelength spectrum in a range of about 45 nm or less, for example, about 40 nm or less, and for example, about 30 nm or less. Color purity or color reproducibility may be improved in this range. Also, because light emitted from the quantum dots is emitted in all directions, an optical viewing angle may be improved.

Also, the shape of the quantum dot is not particularly limited, and commonly used shapes may be used. For example, spherical, pyramidal, multi-arm, or cubic nanoparticles, nanotubes, nanowires, nanofibers, nanoplatelets, or the like may be used.

The quantum dot may control (or dictate) the color of emitted light according to the particle size. Therefore, the quantum dots may have various emission colors, such as blue, red, and green.

The first color filter 310a may transmit only light having a wavelength of about 630 nm to about 780 nm, the second color filter 310b may transmit only light having a wavelength of about 495 nm to about 570 nm, and the third color filter 310c may transmit only light having a wavelength of about 450 nm to about 495 nm. For example, the first color filter 310a may include a color filter that transmits red light, the second color filter 310b may include a color filter that transmits green light, and the third color filter 310c may include a color filter that transmits blue light.

The color filter unit CU may include the first to third color filters 310a, 310b, and 310c, and the light passing through the color conversion layers 320a and 320b and the transmissive layer 320c passes through the first to third color filters 310a, 310b, and 310c. Therefore, the color reproducibility of the display apparatus may be improved. Also, because the display apparatus includes the first to third color filters 310a, 310b, and 310c, the reflection of external light may be reduced.

Figure 7:
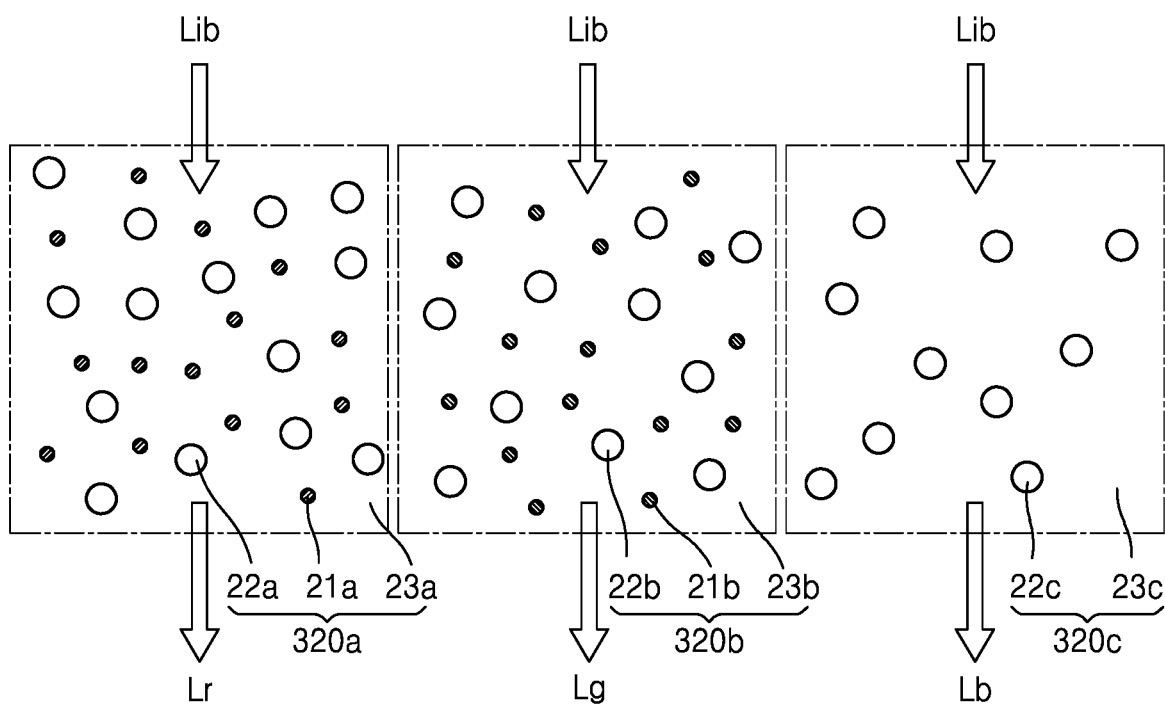
FIG. 7 is a partial enlarged view of a display apparatus according to an embodiment.

FIG. 7 is a partial enlarged view of a display apparatus according to an embodiment.

Referring to FIG. 7, the first color conversion layer 320a may convert blue incident light Lib into first color light Lr. The first color conversion layer 320a may include a first photosensitive polymer 23a in which first quantum dots 21a and first scattering particles 22a are dispersed.

The first quantum dots 21a may be excited by the blue incident light Lib to isotropically emit the first color light Lr having a wavelength longer than that of blue light. The first photosensitive polymer 23a may be an organic material having light transmission (e.g., light transmissive) properties. The first scattering particles 22a may allow more first quantum dots 21a to be excited by scattering the blue incident light Lib that is not absorbed by the first quantum dots 21a. Therefore, the color conversion rate of the first color conversion layer 320a may be increased. The first scattering particles 22a may include, for example, metal particles, such as titanium oxide ($TiO_2$). In this embodiment, the first color light Lr may be red light.

The second color conversion layer 320b may convert the blue incident light Lib into second color light Lg. The second color conversion layer 320b may include a second photosensitive polymer 23b in which second quantum dots 21b and second scattering particles 22b are dispersed.

The second quantum dots 21b may be excited by the blue incident light Lib to isotropically emit the second color light Lg having a wavelength longer than that of blue light. The second photosensitive polymer 23b may be an organic material having light transmission properties and may be the same material as the first photosensitive polymer 23a. The second scattering particles 22b may allow more second quantum dots 21b to be excited by scattering the blue incident light Lib that is not absorbed by the second quantum dots 21b. Therefore, the color conversion rate of the second color conversion layer 320b may be increased. The second scattering particles 22b may include, for example, metal particles, such as titanium oxide ($TiO_2$), and may be the same material as the first scattering particles 22a. In this embodiment, the second color light Lg may be green light.

The transmissive layer 320c may transmit the blue incident light Lib and emit the transmitted blue incident light Lib toward the upper substrate 300. The transmissive layer 320c may include a third photosensitive polymer 23c in which third scattering particles 22c are dispersed. The third photosensitive polymer 23c may be, for example, an organic material having light transmission properties, such as a silicone resin or an epoxy resin, and may be the same material as the first photosensitive polymer 23a. The third scattering particles 22c may scatter and emit the blue incident light Lib and may be the same material as the first scattering particles 22a.

Figure 8:
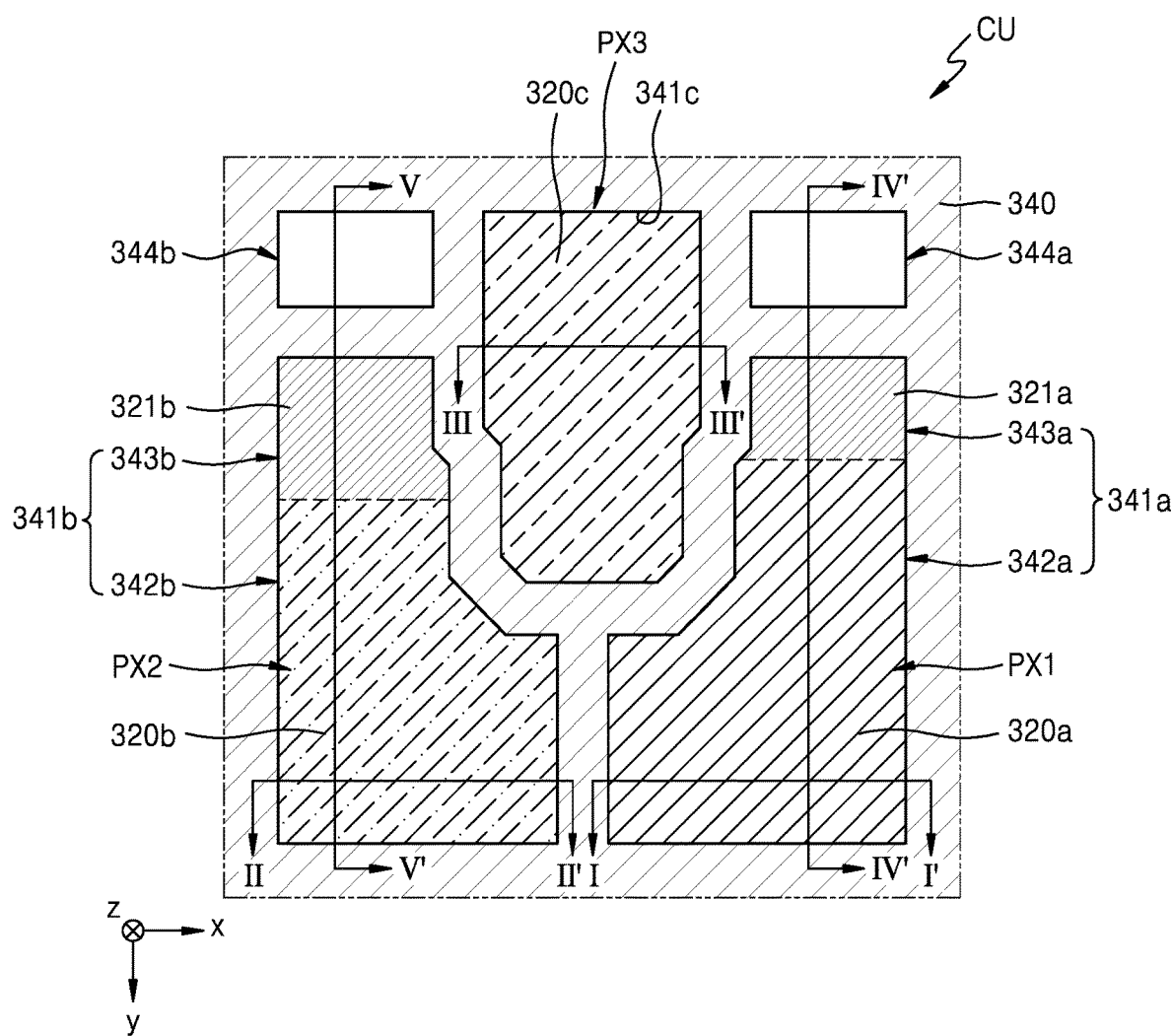
FIG. 8 is a schematic plan view of a color filter unit according to an embodiment.
Figure 9:
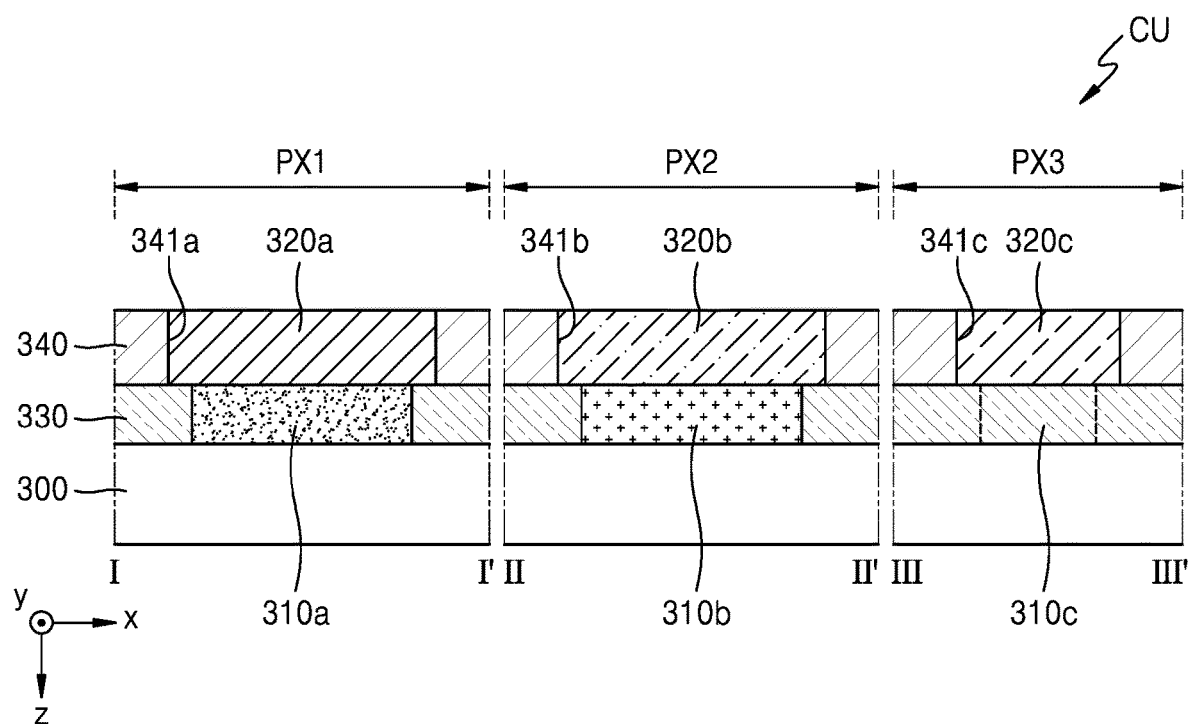
FIG. 9 is a schematic cross-sectional view of a color filter unit according to an embodiment.

FIG. 8 is a schematic plan view of a color filter unit CU according to an embodiment, and FIG. 9 is a schematic cross-sectional view of the color filter unit CU shown in FIG. 8. More specifically, FIG. 9 is a schematic cross-sectional view of the color filter unit CU taken along lines I-I', and III-Ill' of FIG. 8.

Referring to FIGS. 8 and 9, the color filter unit CU may include first to third pixels PX1, PX2, and PX3 that emit different colors. The first to third pixels PX1, PX2, and PX3 may include first to third light-emitting devices (OLED1, OLED2, and OLED3 in, for example, FIG. 18), such as organic light-emitting diodes, respectively. The first to third pixels PX1, PX2, and PX3 may emit, for example, red, green, blue, or white light from the organic light-emitting diodes, respectively. The first to third pixels PX1, PX2, and PX3 may include first to third emission areas (EA1, EA2, and EA 3 in, for example, FIG. 18) in which light generated by the first to third light-emitting devices OLED1, OLED2, and OLED3 is emitted to the outside. Non-emission areas (NEA in, for example, FIG. 18) may be between the first to third emission areas EA1, EA2, and EA3, and the first to third emission areas EA1, EA2, and EA3 may be distinguished by the non-emission areas NEA. The non-emission areas NEA will be described in more detail with reference to FIG. 18.

Because the display apparatus 1 includes the upper substrate 300, it may be described that the upper substrate 300 has a first emission area EA1 corresponding to the first light-emitting device OLED1, a second emission area EA2 corresponding to the second light-emitting device OLED2, a third emission area EA3 corresponding to the third light-emitting device OLED3, and a non-emission area NEA other than the first to third emission areas EA1, EA2, and EA3.

As described above with reference to FIG. 5, the display apparatus 1 may include a display unit DU and a color filter unit CU arranged on the display unit DU. Referring back to FIGS. 8 and 9, the color filter unit CU may include the upper substrate 300, a first partition wall 340, a first color filter 310a, a second color filter 310b, a third color filter 310c, a first color conversion layer 320a, a second color conversion layer 320b, and a transmissive layer 320c.

Figure 18:
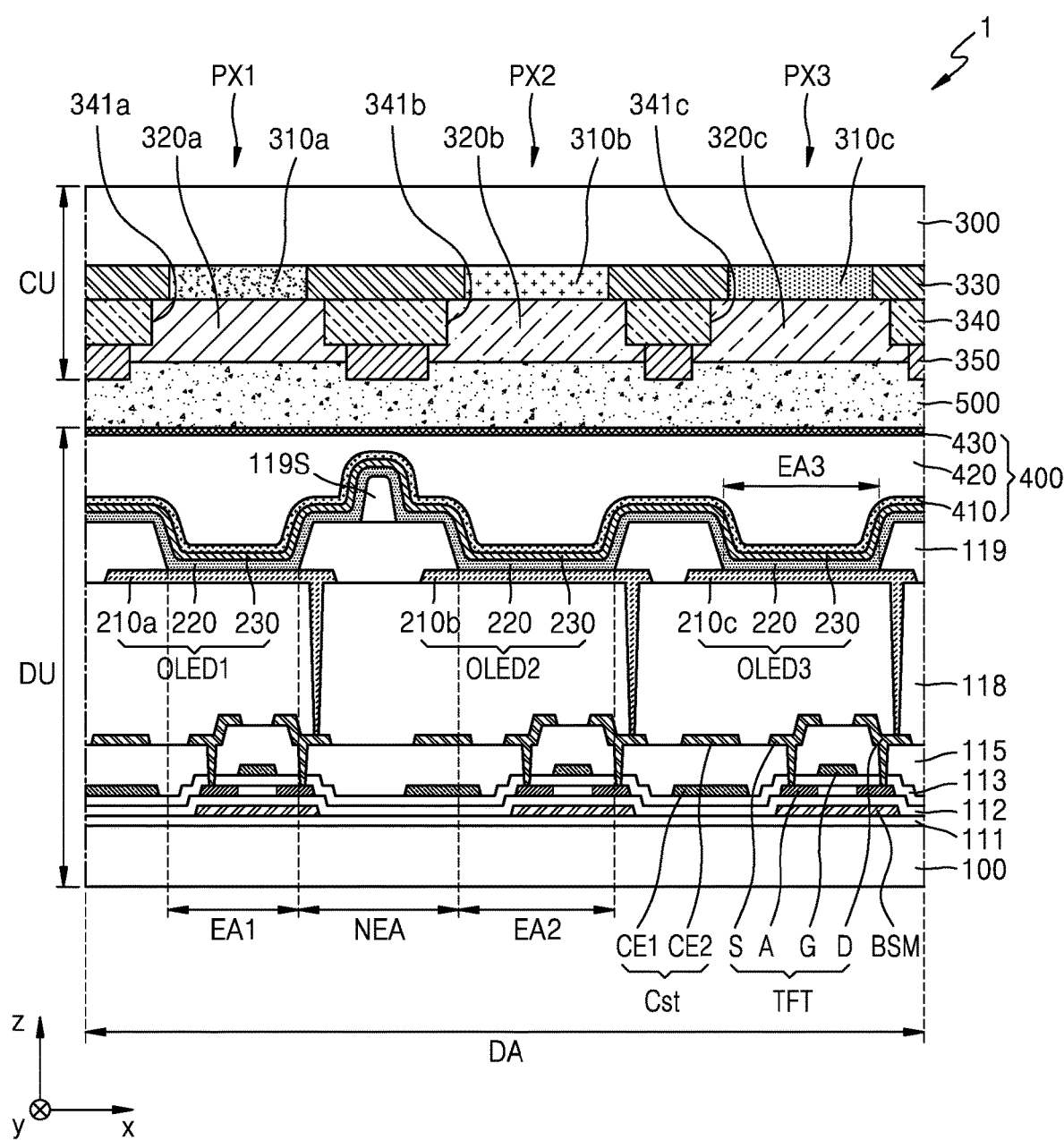
FIG. 18 is a schematic cross-sectional view of a display apparatus according to an embodiment.

Although the various layers are stacked on the upper substrate 300 in the −z direction in the embodiment illustrated in FIG. 8, the color filter unit CU, according to an embodiment, may be substantially attached to the display unit DU with the top and bottom inverted, as illustrated in, for example, FIG. 18. Hereinafter, the display apparatus 1 will be described in the stacking order on the upper substrate 300.

The upper substrate 300 may include a glass material, a ceramic material, a metal material, or a flexible or bendable material. When the upper substrate 300 is flexible or bendable, the upper substrate 300 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The upper substrate 300 may have a single-layer or multi-layer structure including the above-described materials. In the multi-layer structure, the upper substrate 300 may further include an inorganic layer. In some embodiments, the upper substrate 300 may have an organic/inorganic/organic structure.

A light blocking layer 330, a first color filter 310a, a second color filter 310b, and a third color filter 310c may be arranged on the upper substrate 300.

The light blocking layer 330 is between the first color filter 310a and the second color filter 310b, between the second color filter 310b and the third color filter 310c, and between the third color filter 310c and the first color filter 310a. In an embodiment, the light blocking layer 330 may include the same material as the third color filter 310c. In an embodiment, the light blocking layer 330 is a black matrix and may be a layer that improves color sharpness and contrast. The light blocking layer 330 may include at least one of black pigment, black dye, and black particles. In some embodiments, the light blocking layer 330 may include Cr, CrOx, Cr/CrOx, Cr/CrOx/CrN$_y$, a resin (e.g., carbon pigment, RGB mixed pigment, etc.), graphite, and non-Cr-based materials.

The first color filter 310a may transmit only light having a wavelength of about 630 nm to about 780 nm, the second color filter 310b may transmit only light having a wavelength of about 495 nm to about 570 nm, and the third color filter 310c may transmit only light having a wavelength of about 450 nm to about 495 nm. For example, the first to third color filters 310a, 310b, and 310c may be a red color filter, a green color filter, and a blue color filter, respectively. Light that has passed through the first to third color filters 310a, 310b, and 310c may improve color reproducibility of red, green, and blue colors, respectively.

The first partition wall 340 may include first to third openings 341a, 341b, and 341c exposing at least part of the first to third color filters 310a, 310b, and 310c, respectively. The first partition wall 340 may include, for example, an organic material. In some embodiments, the first partition wall 340 may include a light blocking material to act as a light blocking layer. The light blocking material may include, for example, at least one of black pigment, black dye, black particles, and metal particles. For example, the first partition wall 340 may be black. As another example, the first partition wall 340 may be blue.

A first color conversion layer 320a including first quantum dots that convert incident light into first color light (e.g., Lr in FIG. 7) may be arranged in the first opening 341a defined in the first partition wall 340. A second color conversion layer 320b including second quantum dots that convert incident light into second color light (e.g., Lg in FIG. 7) may be arranged in the second opening 341b defined in the first partition wall 340. A transmissive layer 320c that transmits incident light may be arranged in the third opening 341c defined in the first partition wall 340.

A protective layer may be provided below and/or above the first color conversion layer 320a, the second color conversion layer 320b, the transmissive layer 320c, and the first partition wall 340. The protective layer may protect the first color conversion layer 320a, the second color conversion layer 320b, and the transmissive layer 320c from being contaminated by other elements arranged therebelow and/or thereabove. The protective layer may include an inorganic insulating material. For example, the protective layer may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

Figure 10:
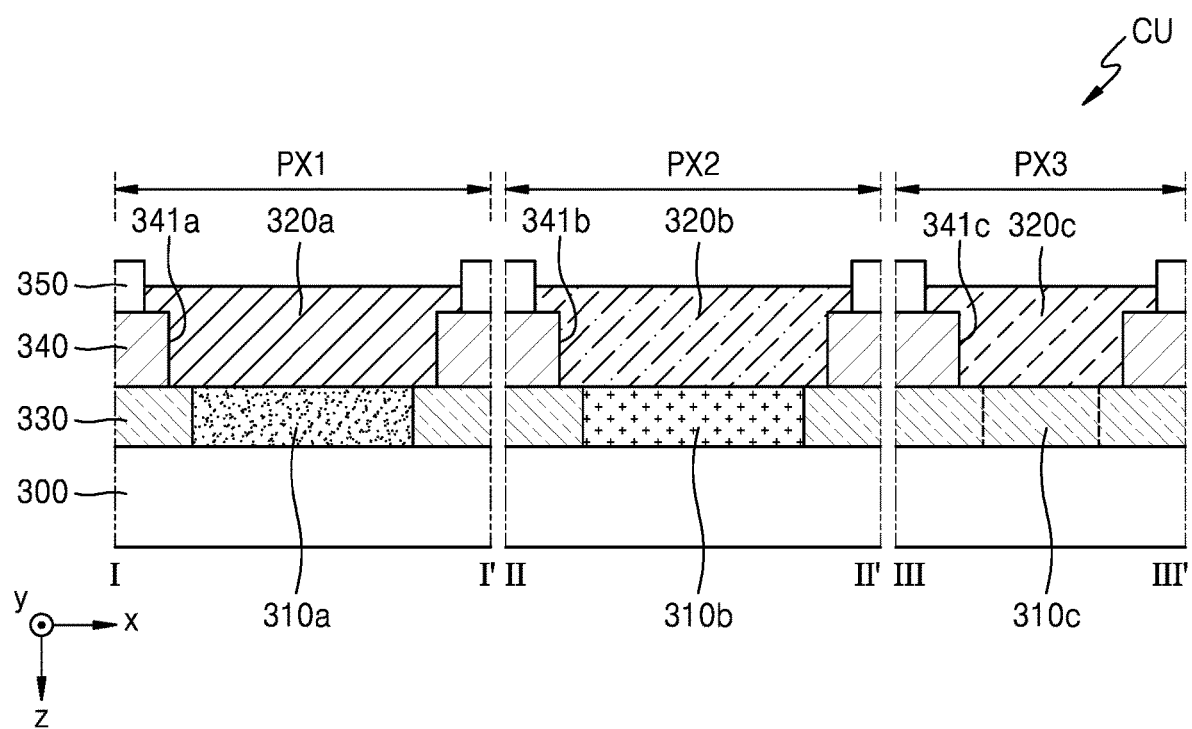
FIG. 10 is a schematic cross-sectional view of a color filter unit according to an embodiment.

FIG. 10 is a schematic cross-sectional view of a color filter unit CU according to an embodiment. The embodiment shown in FIG. 10 differs from the embodiment shown in FIG. 9 in that a second partition wall 350 is arranged on the first partition wall 340. Hereinafter, the description of the embodiment shown in FIG. 10 will primarily focus on differences between the embodiments shown in FIGS. 9 and 10. The other aspects and features of these embodiments are identical or similar.

Referring to FIG. 10, the second partition wall 350 may be arranged on the first partition wall 340. The second partition wall 350 may be arranged to correspond to the first partition wall 340. The second partition wall 350 may include openings corresponding to first to third openings 341a, 341b, and 341c defined in the first partition wall 340. In an embodiment, the second partition wall 350 may include the same material as the first partition wall 340. For example, the first partition wall 340 may be integrally formed with the second partition wall 350. In another embodiment, the second partition wall 350 may include a material different from that of the first partition wall 340.

The second partition wall 350 may include a liquid-repellent (or hydrophobic) material. When the second partition wall 350 includes the liquid-repellent material, the second partition wall 350 may exhibit liquid-repellent properties such that the materials for forming the first color conversion layer 320a, the second color conversion layer 320b, and the transmissive layer 320c are not applied in the non-emission area (e.g., are not applied on the second partition wall 350) during an inkjet process.

Also, the second partition wall 350 may block or absorb light incident from an organic light-emitting diode.

Figure 11:
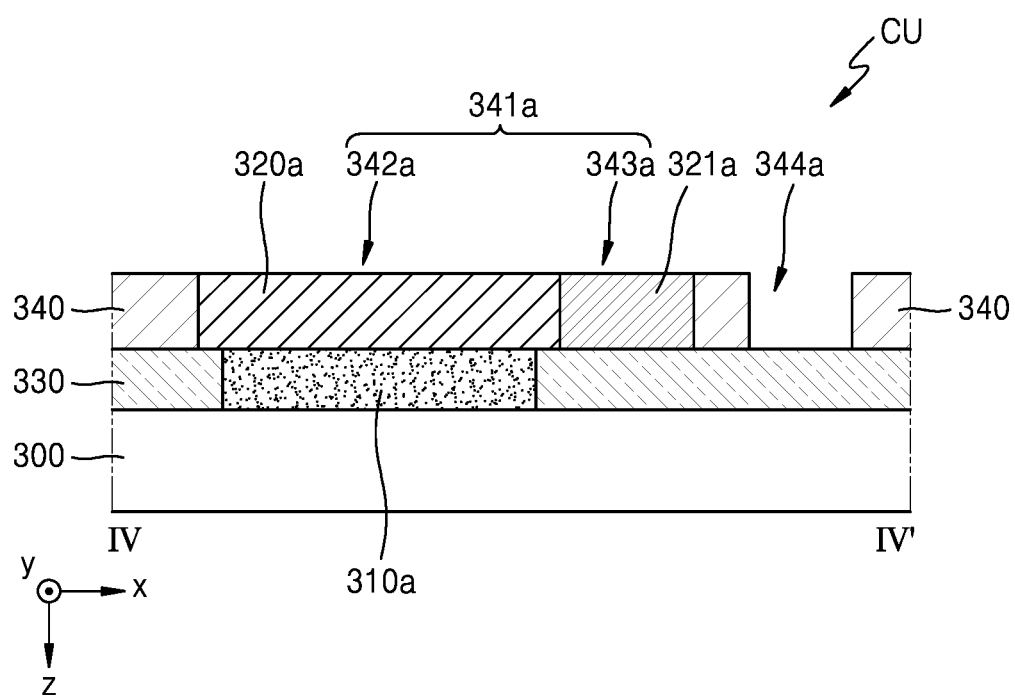
FIG. 11 is a schematic cross-sectional view of a color filter unit according to an embodiment.

FIG. 11 is a schematic cross-sectional view of a color filter unit CU according to an embodiment. More specifically, FIG. 11 is a schematic cross-sectional view of the color filter unit CU taken along the line IV-IV' of FIG. 8.

Referring to FIGS. 8 and 11, the first opening 341a may be defined in the first partition wall 340 of the color filter unit CU according to an embodiment. The first opening 341a may have a first portion 342a overlapping the first color filter 310a and a second portion 343a overlapping the light blocking layer 330.

When the color filter unit CU includes the second portion 343a overlapping the light blocking layer 330, the takt time of the inkjet process may be reduced. Therefore, the efficiency of the inkjet process may be improved.

A first color conversion layer 320a may be arranged in the first portion 342a of the first opening 341a defined in the first partition wall 340, and a first dummy color conversion layer 321a may be arranged in the second portion 343a of the first opening 341a defined in the first partition wall 340. The first dummy color conversion layer 321a may be concurrently (or simultaneously) formed in the same process as the first color conversion layer 320a. However, because the first dummy color conversion layer 321a overlaps the light blocking layer 330, light may not be emitted to the upper portion of the first dummy color conversion layer 321a.

The first partition wall 340 may include a first concave portion 344a. The first concave portion 344a may be defined at an area where ink drop frequently m is-ejects during the inkjet process. The first concave portion 344a defined in the first partition wall 340 may overlap the light blocking layer 330. In an embodiment, the first concave portion 344a defined in the first partition wall 340 may expose at least part of the light blocking layer 330. In another embodiment, when a protective layer is arranged between the first partition wall 340 and the light blocking layer 330, the first concave portion 344a defined in the first partition wall 340 may expose at least part of the protective layer.

The first concave portion 344a may be defined apart from (e.g., may be spaced apart from or separate from) the first opening 341a in the first partition wall 340, in which the first color conversion layer 320a is provided, and the third opening 341c in the first partition wall 340, in which the transmissive layer 320c is provided. For example, in a plan view, the first concave portion 344a in the first partition wall 340 may be defined at a position apart from the first opening 341a in the first partition wall 340 in the y direction and at a position apart from the third opening 341c in the first partition wall 340 in the x direction.

Figure 12:
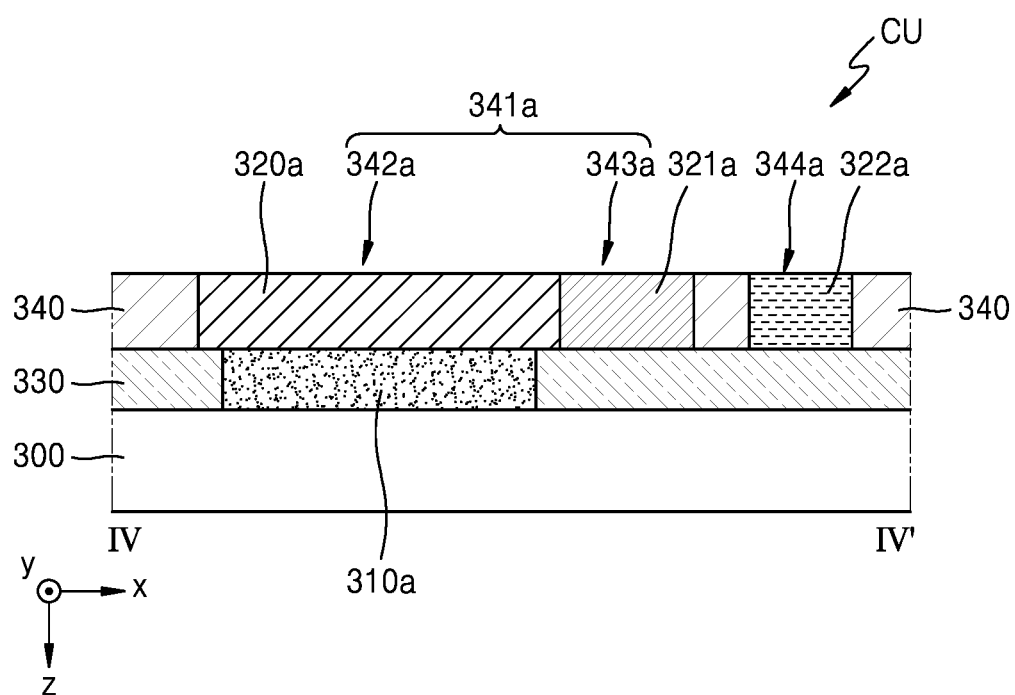
FIG. 12 is a schematic cross-sectional view of a color filter unit according to an embodiment.

FIG. 12 is a schematic cross-sectional view of a color filter unit CU according to an embodiment. More specifically, FIG. 12 is a diagram illustrating a state in which m is-ejected ink is applied to the first concave portion 344a shown in FIG. 11.

Referring to FIG. 12, mis-ejected ink 322a may be arranged (or deposited) in the first concave portion 344a in the first partition wall 340 during an inkjet process. Because the mis-ejected ink 322a is arranged in the first concave portion 344a in the first partition wall 340 during the inkjet process, the substrate 100 and the upper substrate 300 may be spaced apart from each other by a preset distance, and the spacing between the substrate 100 and the upper substrate 300 may be maintained constant (e.g., the mis-ejected ink 322a may not prevent continuous bonding between the substrate 100 and the upper substrate 300).

Figure 13:
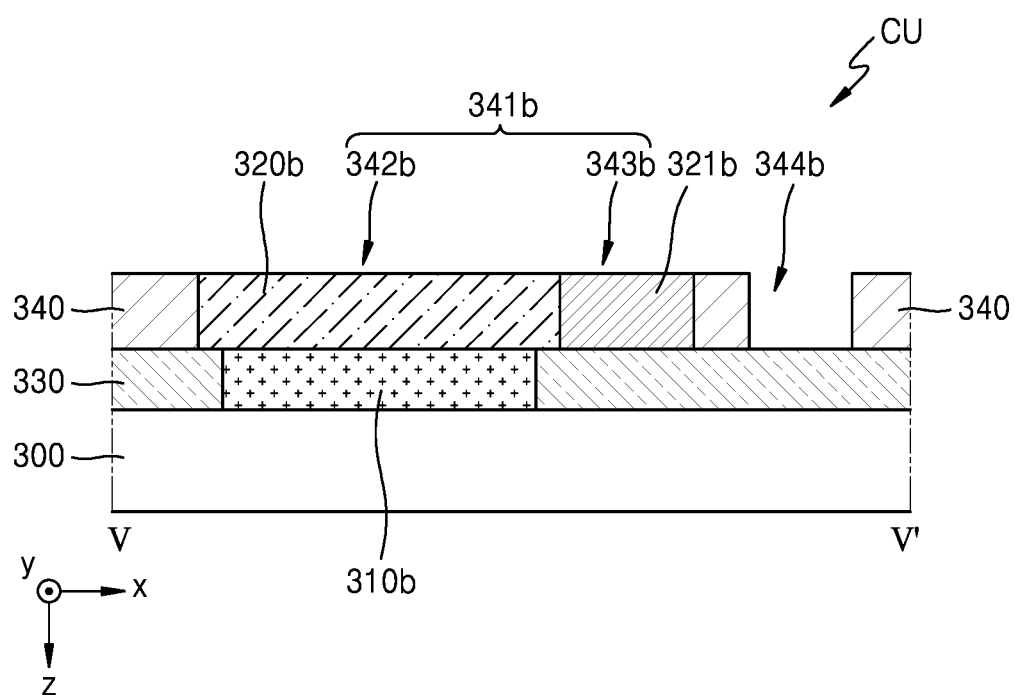
FIG. 13 is a schematic cross-sectional view of a color filter unit according to an embodiment.

FIG. 13 is a schematic cross-sectional view of a color filter unit CU according to an embodiment. More specifically, FIG. 13 is a schematic cross-sectional view of the color filter unit CU taken along the line V-V of FIG. 8.

Referring to FIGS. 8 and 13, the color filter unit CU according to the embodiment may include the first partition wall 340 in which a second opening 341b is defined. The second opening 341b defined in the first partition wall 340 may have a third portion 342b overlapping the second color filter 310b and a fourth portion 343b overlapping the light blocking layer 330.

Because the color filter unit CU has the fourth portion 343b overlapping the light blocking layer 330, the takt time of the inkjet process may be reduced. Therefore, the efficiency of the inkjet process may be improved.

The second color conversion layer 320b may be arranged in the third portion 342b of the second opening 341b defined in the first partition wall 340, and a second dummy color conversion layer 321b may be arranged in the fourth portion 343b of the second opening 341b defined in the first partition wall 340. The second dummy color conversion layer 321b may be concurrently (or simultaneously) formed in the same process as the second color conversion layer 320b. However, because the second dummy color conversion layer 321b overlaps the light blocking layer 330, light may not be emitted to the upper portion of (e.g., emitted light may not reach) the second dummy color conversion layer 321b.

The first partition wall 340 may include a second concave portion 344b. The second concave portion 344b may be defined at an area where mis-ejected ink frequently occurs during the inkjet process. The second concave portion 344b defined in the first partition wall 340 may overlap the light blocking layer 330. In an embodiment, the second concave portion 344b defined in the first partition wall 340 may expose at least part of the light blocking layer 330. In another embodiment, when a protective layer is between the first partition wall 340 and the light blocking layer 330, the second concave portion 344b defined in the first partition wall 340 may expose at least part of the protective layer.

The second concave portion 344b in the first partition wall 340 may be defined as spaced apart from (e.g., may be separate from) the second opening 341b and the third opening 341c in the first partition wall 340. For example, in a plan view, the second concave portion 344b in the first partition wall 340 may be defined at a position apart from the second opening 341b in the first partition wall 340 in the y direction and at a position apart from the third opening 341c in the first partition wall 340 in the x direction.

Figure 14:
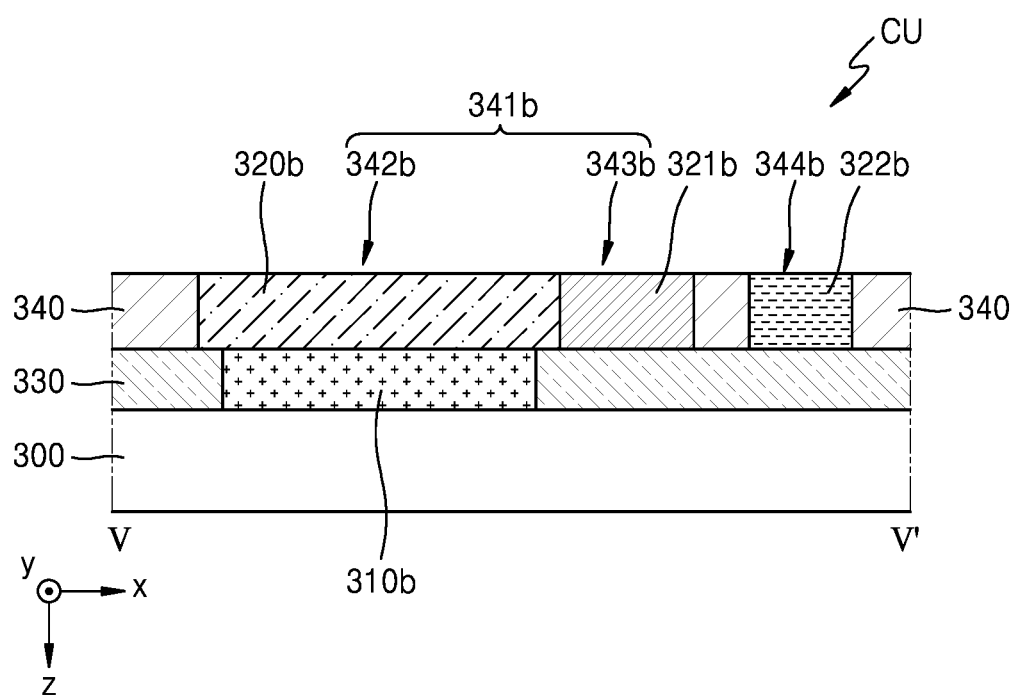
FIG. 14 is a schematic cross-sectional view of a color filter unit according to an embodiment.

FIG. 14 is a schematic cross-sectional view of a color filter unit CU according to an embodiment. More specifically, FIG. 14 is a diagram illustrating a state in which mis-ejected ink is applied to the second concave portion 344b shown in FIG. 13.

Referring to FIG. 14, mis-ejected ink 322b may be arranged (or deposited) in the second concave portion 344b in the first partition wall 340 during an inkjet process. Because the mis-ejected ink 322a is arranged in the second concave portion 344b of the first partition wall 340 during the inkjet process, the substrate 100 and the upper substrate 300 may be spaced apart from each other by a preset distance, and the spacing between the substrate 100 and the upper substrate 300 may be maintained constant.

Figure 15:
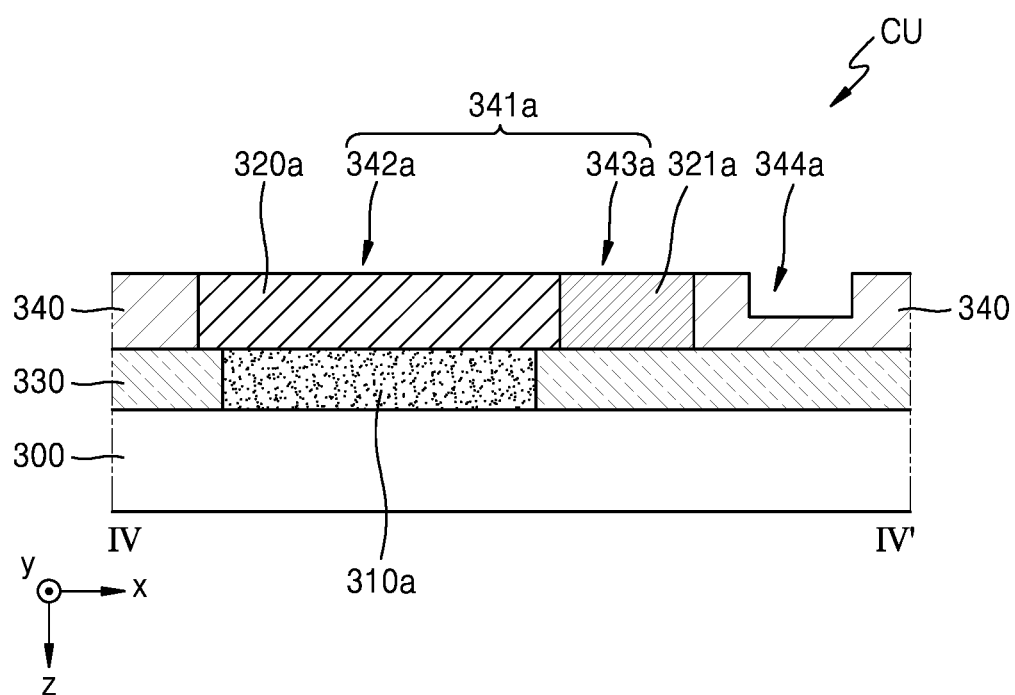
FIG. 15 is a schematic cross-sectional view of a color filter unit according to an embodiment.

FIG. 15 is a schematic cross-sectional view of a color filter unit CU according to an embodiment. The embodiment of FIG. 15 differs from the embodiment of FIG. 11 in that the first concave portion 344a does not expose a configuration arranged therebelow. Hereinafter, the embodiment illustrated in FIG. 15 will be described primarily based on differences with the previously-described embodiments. The other aspects and features are identical or similar to the above-described embodiments.

Referring to FIG. 15, the first concave portion 344a defined in the first partition wall 340 may not expose the configuration arranged therebelow. For example, because the first concave portion 344a defined in the first partition wall 340 is formed by using a half-tone mask or the like, the first concave portion 344a may be thinner than the first partition wall 340 (e.g., the first concave portion 344a may be a thinned portion of the first partition wall 340) and may have a constant (or substantially constant) thickness from the upper surface of the configuration arranged therebelow. Therefore, an amount of a filler 500 used to bond the substrate 100 to the upper substrate 300 may be reduced and defects, such as spot stains, may be reduced or prevented.

Figure 16:
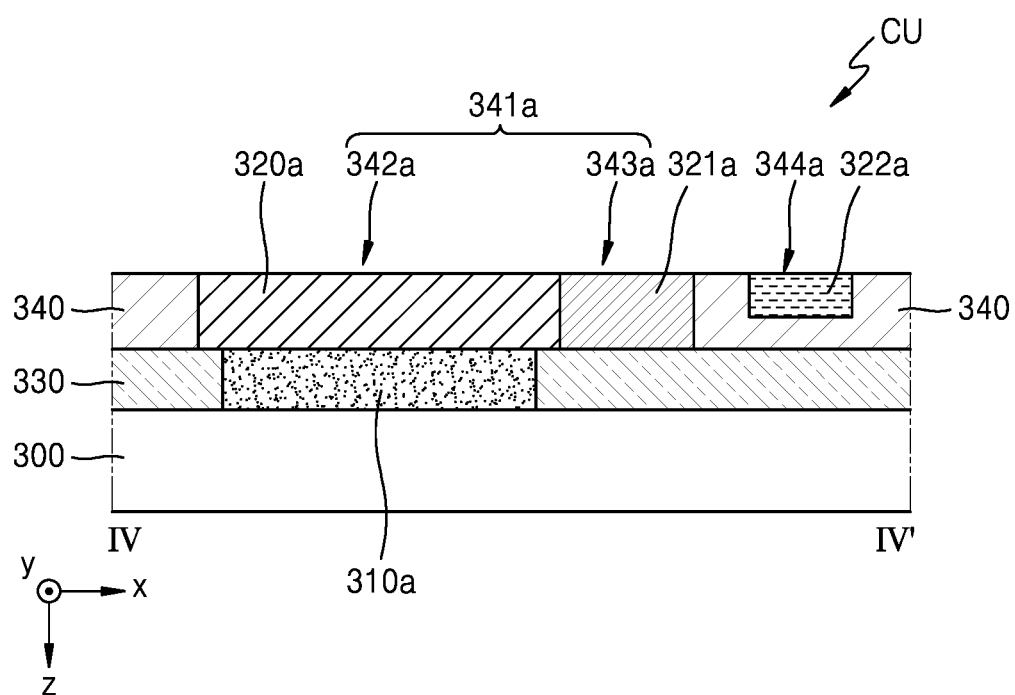
FIG. 16 is a schematic cross-sectional view of a color filter unit according to an embodiment.

FIG. 16 is a schematic cross-sectional view of a color filter unit CU according to an embodiment. More specifically, FIG. 16 is a diagram illustrating a state in which m is-ejected ink is applied to the first concave portion 344a shown in FIG. 15.

Referring to FIG. 16, the first concave portion 344a in the first partition wall 340 may be thinner than the first partition wall 340 and may have a constant thickness from the upper surface of the configuration arranged therebelow. Mis-ejected ink 322a may be arranged (or deposited) in the first concave portion 344a in the first partition wall 340 during an inkjet process. Because the mis-ejected ink 322a is arranged in the first concave portion 344a in the first partition wall 340 during the inkjet process, the substrate 100 and the upper substrate 300 may be spaced apart from each other by a preset distance, and the spacing between the substrate 100 and the upper substrate 300 may be maintained constant.

Figure 17:
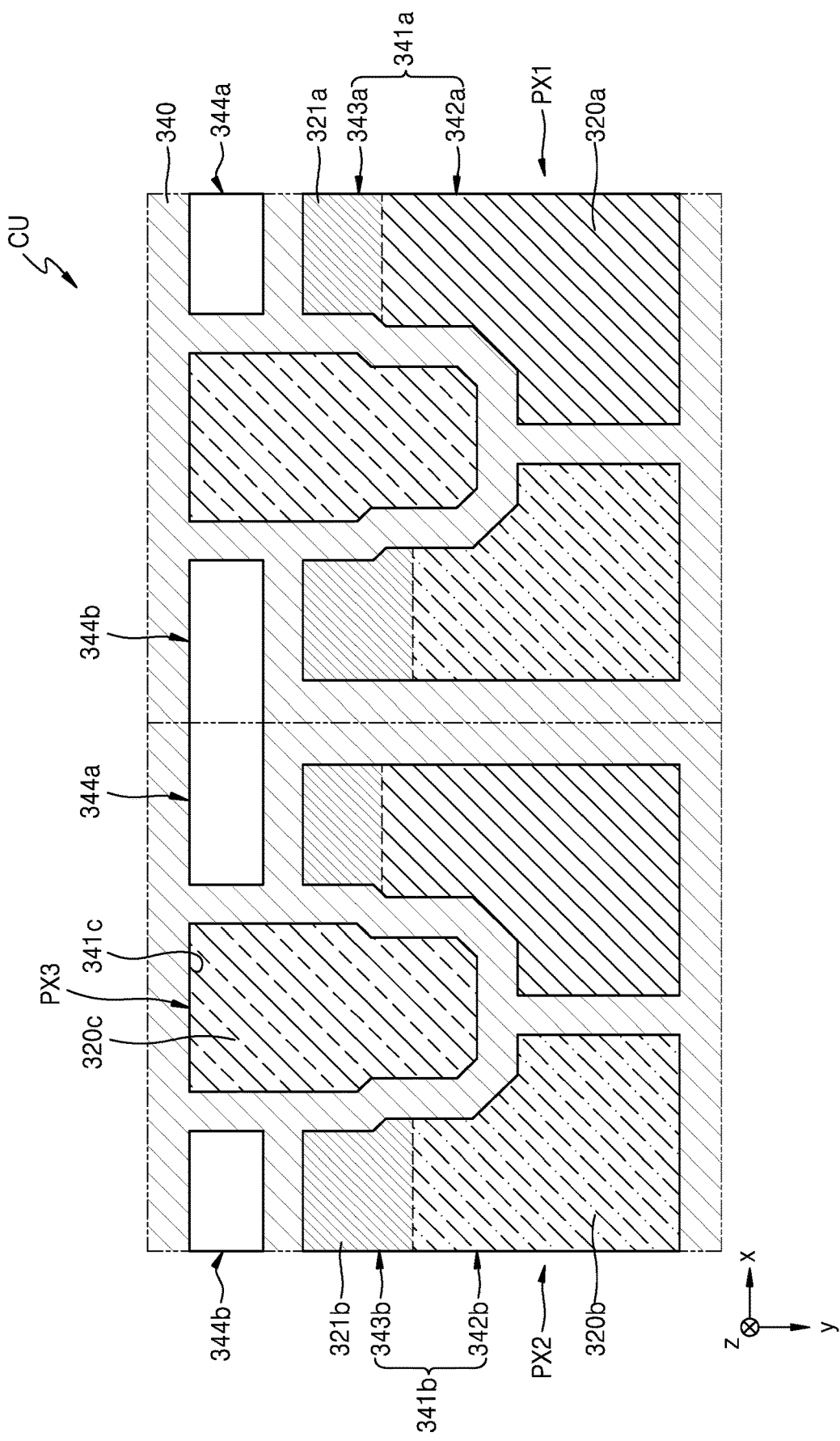
FIG. 17 is a schematic plan view of a color filter unit according to an embodiment.

FIG. 17 is a schematic plan view of a color filter unit CU according to an embodiment. The embodiment of FIG. 17 differs from the embodiment shown in FIG. 8 in that the first concave portion 344a defined in the first partition wall 340 is integrally formed with the second concave portion 344b defined in the first partition wall 340. Hereinafter, the description of the embodiment shown in FIG. 17 will primarily focus on differences with the above-described embodiments. The other configurations are identical or similar to the above-described embodiments.

Referring to FIG. 17, the first partition wall 340 may have the first concave portion 344a and the second concave portion 344b. In an embodiment, the first concave portion 344a may be integrally formed with the second concave portion 344b. For example, the second concave portion 344b may be a portion in which the first concave portion 344a extends in the x direction (e.g., the second concave portion 344b may extend from the first concave portion 344a in the x direction). Because the first concave portion 344a is integrally formed with the second concave portion 344b, defects caused by ink mis-ejection may be effectively prevented during an inkjet process.

FIG. 18 is a schematic cross-sectional view of the display apparatus 1 according to an embodiment.

Referring to FIG. 18, the display apparatus 1 according to an embodiment may include a first pixel PX1, a second pixel PX2, and a third pixel PX3. But this is only an example, and the display apparatus 1 may include more pixels.

The first to third pixels PX1, PX2, and PX3 may include first to third emission areas EA1, EA2, and EA3, respectively. The first to third emission areas EA1, EA2, and EA3 may be areas in which light is generated and emitted to the outside. Non-emission areas NEA may be arranged between (e.g., between each of) the first to third emission areas EA1, EA2, and EA3, and the first to third emission areas EA1, EA2, and EA3 may be distinguished by the non-emission areas NEA.

The first to third pixels PX1, PX2, and PX3 may implement (or emit) light of different colors. For example, the first pixel PX1 may emit red light, the second pixel PX2 may emit green light, and the third pixel PX3 may emit blue light.

In a plan view, the first to third emission areas EA1, EA2, and EA3 may have various polygonal shapes or a circular shape. Also, the first to third emission areas EA1, EA2, and EA3 may have various arrangements, such as a stripe arrangement and a PenTile arrangement.

The display apparatus 1 according to the embodiment may include a first color conversion layer 320a, a second color conversion layer 320b, and a transmissive layer 320c corresponding to the first to third emission areas EA1, EA2, and EA3, respectively. The first color conversion layer 320a, the second color conversion layer 320b, and the transmissive layer 320c may each include quantum dots and metal nanoparticles.

For example, the first pixel PX1 may include the first color conversion layer 320a, the second pixel PX2 may include the second color conversion layer 320b, and the third pixel PX3 may include the transmissive layer 320c. In the illustrated embodiment, the average sizes of the quantum dots included in the first and second color conversion layers 320a and 320b may be different from each other.

Hereinafter, the display apparatus according to the embodiment will be described in detail according to the stacking order illustrated in FIG. 18.

The substrate 100 may include a glass material, a ceramic material, a metal material, or a flexible or bendable material. When the substrate 100 is flexible or bendable, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a single-layer or multi-layer structure including the above-described materials. When the substrate 100 has the multi-layer structure, the substrate 100 may further include an inorganic layer. In an embodiment, the substrate 100 may have an organic/inorganic/organic structure.

A barrier layer may be included between the substrate 100 and a first buffer layer 111. The barrier layer may prevent or reduce impurities from the substrate 100 or the like from penetrating into a semiconductor layer A. The barrier layer may include an inorganic material, such as oxide or nitride, an organic material, or an organic/inorganic composite, and may have a single-layer structure or a multi-layer structure including an inorganic material and an organic material.

A bias electrode BSM corresponding to a thin-film transistor TFT may be arranged on the first buffer layer 111. A voltage may be applied to the bias electrode BSM. Also, the bias electrode BSM may prevent (or substantially prevent) external light from reaching the semiconductor layer A. Therefore, characteristics of the thin-film transistor TFT may be stabilized. In some embodiments, the bias electrode BSM may be omitted.

The semiconductor layer A may be arranged on a second buffer layer 112. The semiconductor layer A may include amorphous silicon or polycrystalline silicon. In another embodiment, the semiconductor layer A may include an oxide of at least one selected from indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layer A may include a Zn oxide-based material, such as Zn oxide, In—Zn oxide, and Ga—In—Zn oxide. In another embodiment, the semiconductor layer A may include In—Ga—Zn—O (IGZO), In—Sn—Zn—O (ITZO), or In—Ga—Sn—Zn—O (IGTZO) semiconductor, in which a metal such as indium (In), gallium (Ga), or tin (Sn) is included in ZnO. The semiconductor layer A may include a channel region with a source region and a drain region arranged on both sides of the channel region. The semiconductor layer A may have a single layer or a multi-layer structure.

A gate electrode G may be arranged on the semiconductor layer A with a first gate insulating layer 113 therebetween, such that the gate electrode G overlaps at least part of (e.g., at least partially overlaps) the semiconductor layer A. The gate electrode G may include molybdenum (Mo), aluminum (Al), copper (Cu), titanium (Ti), or the like and may have a single layer or a multi-layer structure. For example, the gate electrode G may include a single Mo layer. A first electrode CE1 of a storage capacitor Cst may be arranged on the same layer as the gate electrode G. The first electrode CE1 may include the same material as that of the gate electrode G.

Although the gate electrode G of the thin-film transistor TFT and the first electrode CE1 of the storage capacitor Cst are separately arranged in the embodiment illustrated in FIG. 18, in another embodiment, the storage capacitor Cst may overlap the thin-film transistor TFT, and the gate electrode G of the thin-film transistor TFT may function as the first electrode CE1 of the storage capacitor Cst.

A second insulating layer 115 may be provided to cover the gate electrode G of the thin-film transistor TFT and the first electrode CE1 of the storage capacitor Cst. The second insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A second electrode CE2, a source electrode S, and a drain electrode D of the storage capacitor Cst may be arranged on the second insulating layer 115.

The second electrode CE2, the source electrode S, and the drain electrode D of the storage capacitor Cst may each include a conductive material including molybdenum (Mo), aluminum (Al), copper (Cu), titanium (Ti), and the like and may each have a single layer or a multi-layer structure including the above-described materials. For example, the second electrode CE2, the source electrode S, and the drain electrode D may each have a multi-layer Ti/Al/Ti structure. The source electrode S and the drain electrode D may be connected to the source region or the drain region of the semiconductor layer A through contact openings (e.g., contact holes).

The second electrode CE2 of the storage capacitor Cst may overlap the first electrode CE1 with the second insulating layer 115 therebetween and may form a capacitance. In this case, the second insulating layer 115 may act as a dielectric layer of the storage capacitor Cst.

A planarization layer 118 may be arranged on the second electrode CE2, the source electrode S, and the drain electrode D of the storage capacitor Cst, and first to third light-emitting devices OLED1, OLED2, and OLED3 may be arranged on the planarization layer 118.

The planarization layer 118 may have a single layer or a multi-layer structure including an organic material and may have a flat upper surface. The planarization layer 118 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and any blends thereof.

The first to third light-emitting devices OLED1, OLED2, and OLED3 may be arranged on the planarization layer 118 in the display area DA of the substrate 100. The first to third light-emitting devices OLED1, OLED2, and OLED3 may include first to third pixel electrodes 210a, 210b, and 210c, respectively, and may commonly include an intermediate layer 220 and an opposite electrode 230. The intermediate layer 320 may include an organic emission layer.

The first to third pixel electrodes 210a, 210b, and 210c may each include a (semi)transmissive electrode or a reflective electrode. In some embodiments, the first to third pixel electrodes 210a, 210b, and 210c may include a reflective layer and a transparent or semitransparent electrode layer arranged on the reflective layer. The reflective layer may include Ag, Mg, Al, Pt, Pd, Au, Ni, Nd, Ir, Cr, or any compounds thereof. The transparent or semitransparent electrode layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO). In some embodiments, the first to third pixel electrodes 210a, 210b, and 210c may each include ITO/Ag/ITO.

A pixel defining layer 119 may be arranged on the planarization layer 118. Also, the pixel defining layer 119 may increase a distance between the edges of the first to third pixel electrodes 210a, 210b, and 210c and the opposite electrode 230 above the first to third pixel electrodes 210a, 210b, and 210c, thereby preventing or substantially preventing arcs or the like from occurring at the edges of the first to third pixel electrodes 210a, 210b, and 210c.

The pixel defining layer 119 may include at least one organic insulating material selected from polyimide, polyamide, an acrylic resin, benzocyclobutene, and a phenol resin and may be formed by spin coating or the like.

The intermediate layers 220 of the first to third light-emitting devices OLED1, OLED2, and OLED3 may include an organic emission layer. The organic emission layer may include an organic material including a fluorescent or phosphorescent material that emits red, green, blue, or white light. The organic emission layer may include a low molecular weight organic material or a high molecular weight organic material. Functional layers, such as a hole transport layer (HTL), a hole injection layer (HIL), an electron transport layer (ETL), and an electron injection layer (EIL) may optionally be arranged below and above the organic emission layer.

Although the intermediate layers 220 are integrally formed over the first to third pixel electrodes 210a, 210b, and 210c in the embodiment illustrated in FIG. 18, the present disclosure is not limited thereto. The intermediate layers 220 may be variously modified. For example, the intermediate layers 220 may be arranged to correspond to the first to third pixel electrodes 210a, 210b, and 210c, respectively.

In the illustrated embodiment, the first to third light-emitting devices OLED1, OLED2, and OLED3 may include organic emission layers that emit the same color. For example, the first to third light-emitting devices OLED1, OLED2, and OLED3 may each emit blue light. In another example, the first to third light-emitting devices OLED1, OLED2, and OLED3 may each emit mixed blue and green light.

The opposite electrode 230 may include a transmissive electrode or a reflective electrode. In some embodiments, the opposite electrode 230 may include a transparent or semi-transparent electrode and may include a metal thin-film that has a low work function, such as Li, Ca, LiF/Ca, LiF/Al, Al, Ag, Mg, or any compounds thereof. Also, a transparent conductive oxide (TCO) layer, such as ITO, IZO, ZnO, or $In_2O_3$, may be further arranged on the metal thin-film. The opposite electrode 230 may be arranged over the display area DA and the peripheral area PA and may be arranged on the intermediate layer 220 and the pixel defining layer 119. The opposite electrode 230 may be integrally formed in the organic light-emitting diodes OLED to correspond to the pixel electrodes 210a, 210b, and 210c.

A spacer 119S may be further provided on the pixel defining layer 119 to prevent or substantially prevent a mask dent. The spacer 119S may be integrally formed with the pixel defining layer 119. For example, the spacer 119S and the pixel defining layer 119 may be concurrently (or simultaneously) formed in the same process by using a half-tone mask process.

Because the first to third light-emitting devices OLED1, OLED2, and OLED3 may be easily damaged by external moisture or oxygen, a thin-film encapsulation layer 400 may cover and protect the first to third light-emitting devices OLED1, OLED2, and OLED3. The thin-film encapsulation layer 400 may cover the display area DA and extend to the outside of the display area DA. The thin-film encapsulation layer 400 may include at least one organic encapsulation layer and at least one inorganic encapsulation layer. For example, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 230 and may include silicon oxide, silicon nitride, and/or silicon trioxynitride. In some embodiments, other layers, such as a capping layer, may be arranged between the first inorganic encapsulation layer 410 and the opposite electrode 230. Because the first inorganic encapsulation layer 410 is formed along an underlying structure thereof, the upper surface of the first inorganic encapsulation layer 410 may not be flat. The organic encapsulation layer 420 may cover the first inorganic encapsulation layer 410. Different from the first inorganic encapsulation layer 410, the upper surface of the organic encapsulation layer 420 may be substantially flat.

Even when cracks occur in the thin-film encapsulation layer 400, the above-described multi-layer structure of the thin-film encapsulation layer 400 may prevent or substantially prevent these cracks from extending between the first inorganic encapsulation layer 410 and the organic encapsulation layer 420 or extending between the organic encapsulation layer 420 and the second inorganic encapsulation layer 430. Therefore, the formation of a passage through which external moisture or oxygen penetrate into the display area DA may be prevented or reduced.

A filler 500 may be arranged on the thin-film encapsulation layer 400. The filler 500 may act as a buffer against external pressure. The filler 500 may include an organic material, such as methyl silicone, phenyl silicone, or polyimide. However, the present disclosure is not limited thereto, and the filler 500 may include an organic sealant, such as a urethane-based resin, an epoxy-based resin, and an acryl-based resin, or an inorganic sealant, such as silicone.

The upper substrate 300 may be located above the substrate 100, and the opposite electrode 230 may be between the substrate 100 and the upper substrate 300. The upper substrate 300 may include glass, metal, or a polymer resin.

A light blocking layer 330, a first partition wall 340, and a second partition wall 350 may be sequentially arranged on the lower surface of the upper substrate 300 in the direction of (e.g., on a surface facing) the substrate 100. The light blocking layer 330 may have openings corresponding to the first to third emission areas EA1, EA2, and EA3, respectively, and first to third color filters 310a, 310b, and 310c may be arranged in the openings, respectively. Also, the first partition wall 340 may have first to third openings 341a, 341b, and 341c corresponding to the first to third emission areas EA1, EA2, and EA3, respectively. The first color conversion layer 320a may be arranged in the first opening 341a, the second color conversion layer 320b may be arranged in the second opening 341b, and the transmissive layer 320c may be arranged in the third opening 341c.

When the first color conversion layer 320a, the second color conversion layer 320b, and the transmissive layer 320c are formed by the inkjet process, defects may occur due to mis-ejected ink in the non-emission area. For example, the substrate 100 and the upper substrate 300 have to be spaced apart from each other by an interval (e.g., a distance or present interval or distance). However, the spacing between the substrate 100 and the upper substrate 300 may increase due to the m is-ejected ink, and the spacing may be non-uniform according to a position along the display apparatus 1.

The first concave portion 344a and the second concave portion 344b, which are defined in the first partition wall 340 of the display apparatus 1 according to an embodiment, may be defined at an area or areas where mis-ejected ink frequently occurs during the inkjet process. Therefore, mis-ejected ink may be applied to the first concave portion 344a and the second concave portion 344b of the first partition wall 340.

Because the first partition wall 340 has the first concave portion 344a and the second concave portion 344b and mis-ejected ink is arranged in the first concave portion 344a and the second concave portion 344b in the first partition wall 340, the substrate 100 and the upper substrate 300 may be spaced apart from each other by a distance (e.g., a present distance or interval), and the spacing between the substrate 100 and the upper substrate 300 may be constantly maintained.

Also, the first opening 341a in the first partition wall 340 may have a first portion 342a and a second portion 343a. The first color conversion layer 320a may be arranged in the first portion 342a of the first opening 341a, and a first dummy color conversion layer 321a may be arranged in the second portion 343a of the first opening 341a.

Because the first opening 341a in the first partition wall 340 has the second portion 343a and the first dummy color conversion layer 321a is arranged in the second portion 343a of the first opening 341a, the takt time of the inkjet process may be reduced and the efficiency of the inkjet process may be improved.

Although embodiments of a display apparatus have been described herein, the present disclosure is not limited thereto. For example, it may be understood that methods of manufacturing the display apparatus also fall within the scope of the present disclosure.

As described above, according to embodiments, when the partition wall has the concave portion, defects caused by mis-ejected ink may not occur in the display apparatus. But the scope of the present disclosure is not limited to these aspects and features.

It should be understood that the embodiments described herein should be considered in a descriptive sense and not for purposes of limitation. Descriptions of aspects and/or features within each embodiment should typically be considered as available for other similar aspects and/or features in other embodiments. While embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
   a first pixel, a second pixel, and a third pixel respectively configured to emit different colors;
   a first partition wall on a first light-emitting device of the first pixel, the first partition wall having a first opening corresponding to the first light-emitting device and a first concave portion spaced apart from the first opening in a plan view; and
   a first color conversion layer corresponding to an emission area of the first pixel, the first color conversion layer comprising first quantum dots configured to convert incident light into first color light.

2. The display apparatus of claim 1, wherein the first color conversion layer is in the first opening.

3. The display apparatus of claim 1, further comprising:
   a second color conversion layer corresponding to an emission area of the second pixel, the second color conversion layer comprising second quantum dots configured to convert incident light into second color light; and
   a transmissive layer corresponding to an emission area of the third pixel, the transmissive layer comprising scattering particles.

4. The display apparatus of claim 3, wherein the first partition wall has a second opening corresponding to a second light-emitting device of the second pixel, and
   wherein the second color conversion layer is in the second opening.

5. The display apparatus of claim 4, wherein the first partition wall has a second concave portion spaced apart from the second opening in the plan view.

6. The display apparatus of claim 5, wherein the first concave portion is integrally formed with the second concave portion.

7. The display apparatus of claim 3, wherein the first partition wall has a third opening corresponding to a third light-emitting device of the third pixel, and
   wherein the transmissive layer is in the third opening.

8. The display apparatus of claim 3, further comprising:
   a first color filter overlapping the first color conversion layer;
   a second color filter overlapping the second color conversion layer;
   a third color filter overlapping the transmissive layer; and
   a light blocking layer between the first color filter and the second color filter, between the second color filter and the third color filter, and between the first color filter and the third color filter.

9. The display apparatus of claim 8, wherein the first opening has a first portion overlapping the first color filter and a second portion overlapping the light blocking layer.

10. The display apparatus of claim 9, wherein the first color conversion layer is in the first portion of the first opening.

11. The display apparatus of claim 9, further comprising a first dummy color conversion layer in the second portion of the first opening.

12. The display apparatus of claim 9, wherein the first concave portion overlaps the light blocking layer.

13. The display apparatus of claim 9, wherein the first concave portion at least partially exposes the light blocking layer.

14. The display apparatus of claim 9, wherein the third color filter comprises the same material as the light blocking layer.

15. The display apparatus of claim 1, further comprising a second partition wall between the first light-emitting device and the first partition wall.

16. The display apparatus of claim 15, wherein the first partition wall is integrally formed with the second partition wall.

17. A display apparatus comprising:
- a first pixel, a second pixel, and a third pixel respectively configured to emit different colors;
- a display unit comprising a light-emitting device; and
- a color filter unit facing the display unit, the color filter unit comprising:
  - a color conversion layer comprising quantum dots configured to convert incident light; and
  - a partition wall having an opening corresponding to the light-emitting device and a concave portion spaced apart from the opening in a plan view.

18. The display apparatus of claim 17, wherein the color filter unit further comprises a light blocking layer, and
wherein the concave portion overlaps the light blocking layer.

19. The display apparatus of claim 18, wherein the concave portion at least partially exposes the light blocking layer.

20. The display apparatus of claim 17, wherein the color conversion layer is in the opening.

* * * * *